United States Patent
Kurosaka et al.

(10) Patent No.: US 6,315,827 B1
(45) Date of Patent: Nov. 13, 2001

(54) APPARATUS FOR PRODUCING SINGLE CRYSTAL

(75) Inventors: Shoei Kurosaka; Junsuke Tomioka; Masakazu Kobayashi; Kazuhiro Mimura; Kenji Okamura; Hiroshi Monden, all of Hiratsuka; Naritoshi Ohtsukasa, Isehara; Hiroshi Yoshinada, Machida, all of (JP)

(73) Assignee: Komatsu Electronics Metals Co., Ltd. (JP)

( * ) Notice: Subject to any disclaimer, the term of this patent is extended or adjusted under 35 U.S.C. 154(b) by 0 days.

(21) Appl. No.: 09/410,723

(22) Filed: Sep. 30, 1999

(30) Foreign Application Priority Data

Oct. 2, 1998 (JP) .................................. 10-296182
Oct. 9, 1998 (JP) .................................. 10-288431

(51) Int. Cl.$^7$ .................................. C30B 15/30
(52) U.S. Cl. .................. 117/208; 117/13; 117/35; 117/218; 117/911; 117/932
(58) Field of Search .............. 117/35, 218, 911, 117/13, 208, 932

(56) References Cited

U.S. PATENT DOCUMENTS

| | | | |
|---|---|---|---|
| 5,938,843 | * | 8/1999 | Hiraishi et al. ................ 117/218 |
| 5,951,759 | * | 9/1999 | Inagaki et al. ................ 117/218 |
| 6,042,644 | * | 8/1999 | Kurosaka et al. ................ 117/13 |

FOREIGN PATENT DOCUMENTS

| | | |
|---|---|---|
| 62-288191 | 12/1987 | (JP) . |
| 63-252991 | 10/1988 | (JP) . |
| 3-285893 | 12/1991 | (JP) . |
| 10-81581 | 3/1998 | (JP) . |
| 10-182279 | 7/1998 | (JP) . |

* cited by examiner

*Primary Examiner*—Robert Kunemund
(74) *Attorney, Agent, or Firm*—Sheppard, Mullin, Richter & Hampton LLP; James Brueggemann

(57) ABSTRACT

There is described an apparatus for producing a single crystal ingot capable of stably manufacturing a single crystal ingot by means of the Czochralski method, without being affected by influence of variation in extension of wires or an offset in points clamped by a clamping member. The clamping member is engaged with an engagement step formed in a single crystal which is being pulled by the CZ method, and the single crystal is pulled. The single crystal ingot manufacturing apparatus is provided with a flexible mechanism for absorbing variation in extension of the wires, in intermediate portions of the wires. Variation in extension of the wires is eliminated by means of the flexible mechanism, thereby retaining the single crystal in an upright position. Further, a sacrifice member which deforms so as to conform to the circumference of the engagement step is interposed between the clamping member and the engagement step, thereby preventing occurrence of cracking or deformation in the single crystal.

19 Claims, 34 Drawing Sheets

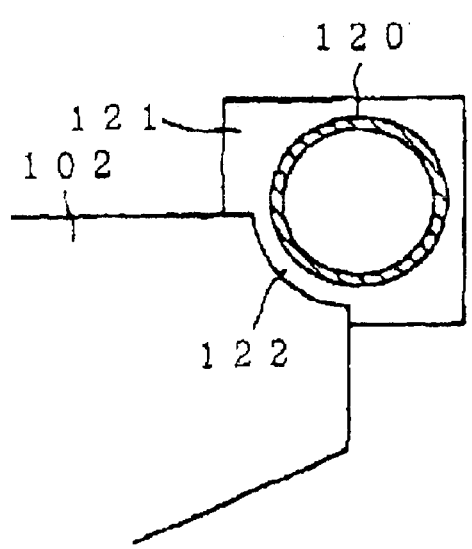 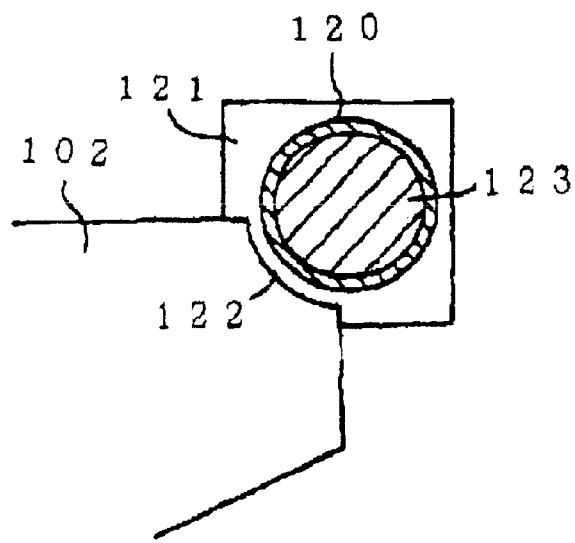
Fig.29(A)　　Fig.29(B)
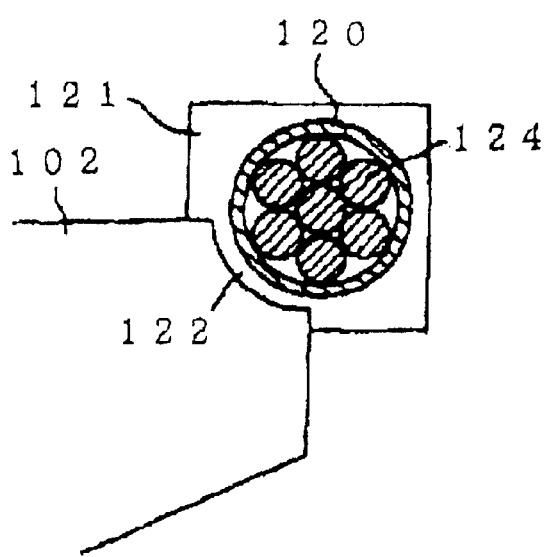 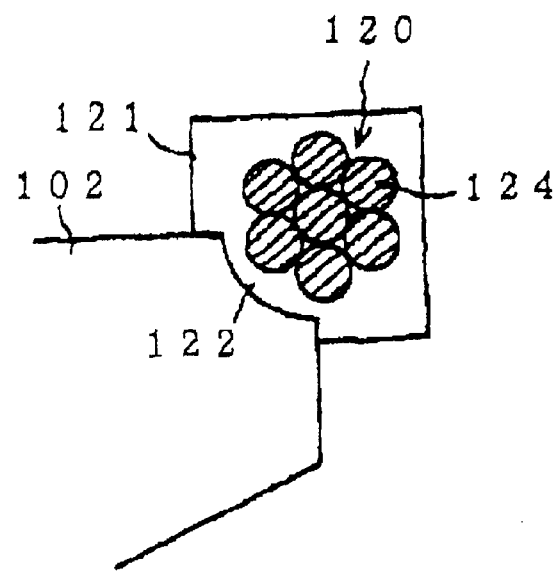
Fig.29(C)　　Fig.29(D)

APPARATUS FOR PRODUCING SINGLE CRYSTAL

BACKGROUND OF THE INVENTION

1. Field of the Invention

The present invention relates to an apparatus for producing a single crystal by pulling a single crystal from source melt by means of the Czochralski method (hereinafter referred to as the "CZ method"), and especially, relates to an apparatus for producing a single crystal by means of the CZ method, suitable for pulling a heavy single crystal having a diameter of greater than 300 mm.

2. Description of the Related Art

A single crystal silicon is generally produced through use of the CZ method. According to the CZ method, polycrystalline silicon is charged into a quartz crucible disposed within a single crystal pulling apparatus. The polycrystalline silicon is heated and dissolved into a melt by means of a heater disposed around the quartz crucible. Subsequently, a seed crystal attached to a seed chuck is immersed into the melt. The seed holder is pulled while the seed chuck and the quartz crucible are rotated in a single direction or in opposite directions, to thereby grow a single crystal to a predetermined diameter and length. Under the CZ method, a neck having a diameter of about 3–4 mm must be formed in a lower portion of the seed crystal by means of the Dash technique in order toeliminate dislocations from the seed crystal. However, in response to a recent tendency for improving the efficiency of production of a semiconductor device, a demand exists for manufacture of a single crystal having a large diameter by means of the CZ method. In association with an increase in the diameter of a single crystal, the weight of the single crystal increases. Single crystal manufacturing apparatus have been suggested (in, for example, Japanese Patent Application Laid-Open Nos. Sho-62-288191 and 63-252991), in which a constricted engagement step is formed in a single crystal remaining in a pulled state so that the heavy single crystal can withstand pulling action.

FIG. 18 shows an example of a conventional single crystal manufacturing apparatus provided with a clamping body. A pull head 2, which is rotatably provided at the upper end of the manufacturing apparatus, has provided therein a crystal pull wire take-up device 3 and a plurality of wire take-up devices 51 for raising/lowering a clamping member 50. A seed chuck 6 holding a seed crystal 5 is fixed to the lower end of a crystal pull wire 4 hanging the crystal pull wire take-up device 3 and extends to the center of a furnace. Melt 7 is stored in a quartz crucible which is disposed within an unillustrated main chamberso as to be able to rotate and move vertically.

The clamping member 50 is provided with a plurality of claws 53 provided in a pivotable manner at the lower end of a cylindrical clamping body 52 (the claws 53 are pivotable within a vertical plane and within a predetermined range of angle). The claws 53 are engaged with an engagement step engagement stepla. By means of this arrangement, a single crystal 1 can be pulled when the wire take-up devices 51 takes up wires 54.

However, the single crystal manufacturing apparatus having the foregoing configuration often encounters a problem of occurrence of an inclination in the single crystal 1 for reasons of an inclination in the gripping member 50 stemming from a variation in extension of the wires 54 (FIG. 19) or for reasons of an offset in points clamped by the gripping member 50 (FIG. 20). If the single crystal 1 is held in a slanted attitude and rotated while the axis of the single crystal 1 is tilted, runouts arising in a growth boundary is amplified, thereby adversely affecting the growth of the single crystal 1 and inducing poly-crystallization of the single crystal 1 arises.

Furthermore, in the event that the clamping member 50 clamps the single crystal 1 at the engagement step 1a with the aid of jaw-shaped claws 53, the weight of the single crystal 1 will focus on several contact points. This will induce cracking or distortion to the single crystal 1. On the worst occasion, the single crystal 1 could be destroyed.

SUMMARY OF THE INVENTION

The object of this invention is to provide an apparatus for producing a single crystal. In the process of pulling a single crystal by the CZ method, the device according to this invention conducts a clamping member to engage with a engagement step formed in the single crystal remaining in a pulled state and is capable of steadily pulling a single crystal without any influence caused by a variation in extension of the wires or dislocating of clamping body.

Another object of this invention is to prevent cracking or distortion of the single crystal when the clamping body clamps the reduced and engagement step formed in the single crystal.

To achieve the above-mentioned objects, this invention is characterized in that: a flexible mechanism (also referred to as a free-pivoting mechanism), having a first flexible member capable of tilting even though the single crystal is being clamped by the clamping body, is provided. By this arrangement, the single crystal can be kept in the verticle attitude by absorbing a variation in extension of the wires through the flexible mechanism.

Furthermore, this invention is characterized in that: a flexible mechanism, having a second flexible member capable of tilting even that the clamping body is being suspended by a plurality of long members, is provided. By this arrangement, the single crystal can be held in the vertical attitude by absorbing an offset in points clamped by a clamping body induced by inconsistency between the contacting points on the engagement step.

Furthermore, as to the flexible mechanism having a first flexible member and the flexible mechanism having a second flexible member, installing either one or both of them simultaneously on the apparatus for producing a single crystal is acceptable.

Furthermore, it is also acceptable to install the flexible mechanism on the apparatus for producing a single crystal either separately or integrally with the clamping body. Furthermore, it has been known that the flexible mechanism is irrelevant to the kinds of single crystals; therefore this invention is not only suitable to devices for producing a single crystal but also suitable to all kinds of single crystal manufacturing devices only if the CZ method is employed.

According to another aspect of the present invention, in a process in which the engagement step through use of the clamping body, a sacrifice member whose shape is fit to the profile of the circumference of the engagement step is interposed between the clamping body and the engagement step, thereby preventing cracking or distortion of the single crystal.

Specifically, in the clamping body of the apparatus for producing a single crystal according to this invention, the portion in contact with the engagement step during the operation of clamping the engagement step with the aid of the clamping body is composed of a sacrifice member, which deforms to fit the outer periphery of the engagement step. By this arrangement, cracking or distortion of the single crystal can be prevented.

Due to the existence of the sacrifice member, the sacrifice member deforms it to fit the outer periphery of the engagement step so as to increase the contact area during the operation of clamping the engagement step with the aid of the clamping body. Therefore, the force applied from the clamping body toward the engagement step is distributed; and cracking or distortion of the single crystal, which inevitably causes the breakage of the single crystal, can be prevented.

As described above, the distinction of this invention is that the force exerted between the clamping body and the engagement step is distributed through the deformation of the sacrifice member. If the sacrifice member is made of elastic-deformation material, then it could be repeatedly used. If the sacrifice member is made of plastic-deformation material, then it is necessary to change the sacrifice member regularly before each operation.

Furthermore, the deformation of the sacrifice member takes place to fit the shape of the outer periphery of the engagement step. However, it is preferred that the deformation of the sacrifice member is not only match with the macroscopic shape of the outer periphery of the engagement step but also match with the microscopic shape such as tiny unevenness on the outer periphery of the engagement step.

Furthermore, it is possible to determine the structure and the material of the sacrifice member according to this invention. Therefore, this invention is adapted to all kinds of single crystals produced by pulling processes. However, in the event of pulling silicon single crystals, it is preferable to choose stainless pipes packed with wires as sacrifice members because they could prevent micro-cracks.

Furthermore, no matter the single crystal to be pulled is a silicon or not, if heat-endurance of sacrifice members is considered to be important, it is preferable to fill tubes up with carbon material so as to fabricate the sacrifice members. The carbon material could be such as: carbon fibers, graphite material, or carbon-fiber-reinforced carbon. However, from the viewpoint that the sacrifice members have to deform a pertinent amount, carbon-fiber-reinforced carbon is the best choice. Moreover, if carbon-fiber-reinforced carbon is used, metal tubes (for example, stainless tubes) can prevent separation of laminated layers in carbon-fiber-reinforced carbon, which is induced by deformation pressure.

Basic Principle of the Flexible Mechanism

According to the flexible mechanism of this invention, the clamping body can tilt around a single crystal remaining in a pulled state in any direction (essentially, an arbitrary angle within 3600) during clamping operation.

An example for this flexible mechanism is shown in FIGS. 21A, 21B, and 21C. In this flexible mechanism, the wires 54 engaging with the wire take-up devices 51 and the wires 54' engaging with the clamping body 50 are respectively engaging with a plate body 55 with a 900 angular displacement. In this case, the joints 54p of the wires 54 and the plate body 55 and the joints 54'p of the wires 54' and the plate body 55 are fabricated in a manner that the wires 54, 54' are capable of freely rotating with respect to the plate body 55.

Therefore, if either wires 54' is pulled downward alone when the wires 54 are fixed, then the plate body 55 will be pivotally supported by the wires 54 and tilt around the X-axis.

In contrast, if the respective wires 54 are pulled upward while the wires 54' are fixed, the plate body 55 is supported by the wires 54' and is pivoted about the Y-axis.

Accordingly, when the flexible mechanism shown in FIGS. 21A, 21B, and 21C is interposed between the wire take-up devices 51 and the clamping body 50 and a variation in extension of the wires 54 occurs; the wires 54' remain unmoved and the plate body 55 solely tilts around the Y-axis. Therefore, a variation in extension of the wires 54 will not shift to the clamping body 50, and the single crystal remaining in a pulled state will not tilt. On the other hand, when the clamping body 50 dislodges its clamping points, the plate body 55 tilts around the X-axis to absorb the dislocation and the wires 54 remain unmoved. Consequently, the single crystal can be held in its clamped attitude and can be driven to rotate freely. Accordingly, runout of the single crystal axis will not arise. Furthermore, even though a variation in extension of the wires 54 and dislocation of the clamping points of the clamping body 50 occur simultaneously, both of them will be absorbed and nullified by the flexible mechanism shown in FIGS. 21A, 21B, and 21C.

As described above, both of the impertinent situations occurred respectively above and below the flexible mechanism can be nullified by only disposing the flexible mechanism therebetween. Therefore, single crystals can be steadily produced without any influence induced by a variation in extension of the wires 54 or dislocation of the clamping points of the clamping body 50.

Moreover, in the above flexible mechanism, the plate body 55 was used as the flexible member capable of tilting during clamping the single crystal by the clamping body 50 or suspending the clamping body 50 by long members. The flexible member plays double roles of a first flexible member and a second flexible member. The first flexible member is capable of tilting during clamping the single crystal by the clamping body 50 and the second flexible member is capable of tilting during suspending the clamping body 50 by long members.

An Alternative Example for the Flexible Mechanism

As shown in FIGS. 22A, 22B, and 22C (wherein members having the same functions as those shown in FIGS. 21A, 21B, and 21C are designated identical numerals), two plies of the flexible mechanism shown in FIGS. 21A, 21B, and 21C are linked together through one pair of connecting wires 54". The upper plate body 55 and the lower plate body 55' are capable of respectively tilting around the Y-axis and the Y'-axis alone. Therefore, the dimensional discrepancy induced respectively above and below the flexible mechanisms can be nullified by the flexible mechanisms. Accordingly, single crystals can be steadily produced without any influence induced by a variation in extension of wires and dislocation of the clamping points of the clamping body.

Furthermore, in the flexible mechanism shown in FIGS. 22A, 22B, and 22C, the plate bodies 55 and 55' are flexible members. The upper plate body 55 is the first flexible member capable of tilting in the state of clamping the single crystal by the clamping body 50, and the lower plate body 55' is the second flexible member capable of tilting while the clamping body 50 is suspended by long members.

Furthermore, in the flexible mechanism shown in FIGS. 22A, 22B, and 22C, it is also acceptable to install the clamping body 50 directly on the lower plate body 55' without disposing the clamping body 50 at the lower portions of the wires 54'.

The flexible mechanism shown in FIGS. 23A, 23B, 23C, 23D and 23E (wherein members having the same functions as those shown in FIGS. 21A, 21B, 21C, 22A, 22B, and 22C are designated identical numerals) is composed of pulleys 57 and 57' instead of the plate body 55 capable of tilting. As shown in FIG. 23A, the wire 54 is passing around the wheel of the moving pulley 57, and the wire 54' is installed on the axis of the moving pulley 57 in a sliding manner (namely, the wire 54' is unable to be wrapped up by the axis of the moving pulley 57). By this arrangement, when a variation in extension of the wires 54 occurs, the moving pulley 57 rotates by only the magnitude of a variation in extension, whereby the variation in extension is thus nullified. On the other hand, the wire 54' is passing around the wheel of the pulley 57' and the wire 54 is installed on the axis of the pulley 57' in a manner capable of sliding. Therefore, basing on the same rule, the offset in the points clamped by the clamping body could also be nullified.

Accordingly, as in the case of the previous example shown in FIGS. 21A, 21B, and 21C, impertinent situations (dimensional discrepancy) respectively occurred above and below the flexible mechanism can be nullified by the flexible mechanism. Furthermore, as shown in FIGS. 23C and 23D, when one flexible mechanism 56 is composed by connecting the moving pulley 57 and the pulley 57' with connecting wires 54", there can be yielded substantially the same working-effects as those yielded by the example shown in FIGS. 22A, 22B, and 22C can be obtained.

In addition, when the dimensional discrepancy induced by length dispersion among plural long members and the dimensional discrepancy induced by an offset in the points clamped by the clamping body on the engagement step are absorbed by a flexible mechanism composed by one set of pulleys, twisting of the wires 54" can be prevented by using axis holding members 54"' to disrupt the coaxiality between the set of the rotating axes.

Beside the previous examples, the flexible mechanism shown in FIGS. 24A, 24B and 24C (wherein members having the same functions as those shown in FIGS. 21A to 23E are designated identical numerals) is composed of two plate bodies 55, 55' and a spring body 58 disposed therebetween. By this arrangement, a variation in extension of the wires 54 can be absorbed by the elastic deformation of the spring body 58, and the same functions and effects as those of the previous examples can be obtained. Furthermore, according to this example, if movements are constrained within a small scope, two plate bodies 55, 55' can respectively sway freely in any direction (namely, an arbitrary angle within 360°) alone.

Moreover, in the flexible mechanism shown in FIGS. 24A, 24B and 24C, the same as the flexible mechanism shown in FIGS. 22A, 22B, and 22C, the first flexible member is the upper plate body 55 and the second flexible member is the lower plate body 55'. In addition, in the flexible mechanism shown in FIGS. 24A, 24B, and 24C, it is also acceptable to install the clamping body 50 directly on the lower plate body 55' without disposing the clamping body 50 at the lower portions of the wires 54'.

Moreover, as shown in FIGS. 25A and 25B (wherein members having the same functions as those shown in FIGS. 21A to 24C are assigned identical numerals), the flexible mechanism can be constructed by an infinity sliding ball-spline structure. Namely, in this example, wires 54' are connecting with an outer shell 59", and wires 54' are connecting with an inner shell 59'. Plural balls 59 are packed within an annular rail formed between the outer shell 59" and the inner shell 59'. The outer shell 59" and the inner shell 59' are respectively capable of tilting alone through rolling of the balls.

Therefore, when a variation in extension of the wires 54 occurs, the outer shell 59" tilts in a direction in favor of nullifying the variation in extension. Thus, during employing the flexible mechanism shown in FIGS. 25A and 25B, single crystals could be steadily pulled without any influence caused by a variation in extension of the wires or an offset in the points clamped by the clamping body.

Furthermore, in this example, it is needless to rotate the outer shell 59" through the wires 54. Namely, when the wires 54 coupled with the single crystal 1 is rotated through the rotating of the wire 4; the inner shell 59' will be driven to rotate. However, invalid rotations of the balls 59 take place, and it is also satisfactory to keep the outer shell 59" unmoved.

!In the flexible mechanism shown in FIG. 25, the first flexible member corresponds to the outer shell 59", and the second flexible member corresponds to the inner shell 59'. Similarly, even in the flexible mechanism shown in FIGS. 25A and 25B, the clamping member 50 may be directly attached to the inner shell 59' rather than being provided at a lower portion of the wires 54'.

The following are descriptions of scopes to be claimed, which are based on the above-described principles and bring forth the intended effects.

(1) An apparatus for producing a single crystal, which forms a engagement step in the single crystal remaining in a pulled state by the CZ method and suspends the single crystal with the aid of the engagement step, comprising: a clamping body used for clamping the engagement step, and at least two contact points in contact with the engagement step being provided; a plurality of long members for suspending the clamping body; and a flexible mechanism having a first flexible member capable of tilting even that the single crystal is being clamped by the clamping body and/or a second flexible member capable of tilting even that the clamping body is being suspended by the long members.

In this case, "wire" is a typical example for "long member", and "wire take-up device" is a typical example for "driving section". The major aspect of this invention resides in nullifying impertinent situations induced by a variation in extension of long members and inclination of the clamping body. Therefore, a long member is not limited to a wire, and any member may be used, so long as the member has a predetermined length and can pull a single crystal which would be finally formed into an ingot.

Furthermore, as described in the following embodiments, in general, a plurality of long members (mostly two) is concurrently used. However, it is also satisfactory to use only one long member (see FIG. 26).

Because any flexible mechanism having the above-described functions could be utilized in this invention, flexible mechanisms not shown in FIGS. 21A to 25B having the same or equivalent functions as those of the above-described should be contained in the concept of the flexible mechanism according to this invention.

Furthermore, the subject of this invention resides in nullifying impertinent situations (dimensional discrepancy) within a mechanism and obviously is irrelevant to what kind of melted material from which the single crystal is pulled. Therefore, the "single crystal" is not limited to silicon single crystals.

Furthermore, it is acceptable to install the flexible mechanism by coupling it at the middle portion of the long member, or alternatively to form it integrally with the clamping body at one end of the long member.

Because the first flexible member is capable of tilting even that the single crystal is being clamped, the first flexible member tilts and absorbs length dispersion occurred between plural long members (see FIG. 19) when it took place.

Furthermore, since the second flexible member is capable of tiling even that the clamping body is being suspended by long members, the second flexible member tilts and absorbs the offset in the points clamped by the clamping body occurred on the engagement step (see FIG. 20) when an offset occurs.

As described above, the first flexible member is employed for nullifying the dimensional discrepancy occurred between plural long members and the second flexible member is employed for nullifying the dimensional discrepancy induced by an offset in the points clamped by the clamping body. Therefore, if both of them are installed in a flexible mechanism, then both the dimensional discrepancies occurred between plural long members and the dimensional discrepancy induced by an offset in the points clamped by the clamping body can be absorbed by the flexible mechanism.

(2) An apparatus for producing a single crystal as described in (1) characterized in that: the flexible member is capable of tilting in any direction within 3600.

(3) An apparatus for producing a single crystal as described in (1) or (2) characterized in that: the flexible mechanism includes an elastic member whose elastic deformation enables the tilting of l the flexible member.

(4) An apparatus for producing a single crystal as described in (1) or (2) characterized in that: the flexible mechanism includes a sliding member whose sliding movement enables the tilting of the flexible member.

A typical example for the device described in above (3) is shown in FIGS. 24A to 24C, and typical examples for the device described in above (4) are shown in FIGS. 6, 7, 14, 15, 16, 17, 25A and 25B. Furthermore, these examples meet to the requirements established in above (2).

(5) An apparatus for producing a single crystal as described in (1) or (2) characterized in that: the flexible mechanism includes a seesaw member capable of tilting around a preset axis, and the flexible member is driven to tilt by the seesaw member.

(6) An apparatus for producing a single crystal as described in (1) or (2) characterized in that: the flexible mechanism is composed of a plurality of seesaw members each of which is capable of tilting around a preset axis, and each axis is not coaxial with others.

The "preset axes" of the flexible mechanism are determined by the structure of the flexible mechanism employed. In the flexible mechanism shown in FIGS. 21A to 22C, the "preset axes" are X-axis and Y-axis shown therein.

Furthermore, it is also acceptable to combine the seesaw member described in (5) or (6) with the sliding member described in (4) so as to construct a flexible mechanism (for example, those shown in FIGS. 6, 7, 14, 15, 16, and 17). On this occasion, it is preferred to dispose a sliding structure restraining balls at the joint portion between long members and coupling portions. By this, the long members could engage with the flexible mechanism in a manner capable of rotating without any restraint (see FIGS. 6 and 7).

(7) An apparatus for producing a single crystal as described in (6) characterized in that: the sum of the plural seesaw members is two.

(8) An apparatus for producing a single crystal as described in (7) characterized in that: the axes of the two seesaw members are perpendicular to each other.

(9) An apparatus for producing a single crystal as described in any one of (1) to (8) characterized in that: the sum of the long members is at least two.

(10) An apparatus for producing a single crystal as described in (9) characterized in that: the sum of the long members is two.

(11) An apparatus for producing a single crystal, which forms a engagement step in the single crystal remaining in a pulled state by the CZ method and suspends the single crystal with the aid of the engagement step, comprising: a clamping body used for clamping the engagement step, and at least two contact points in contact with the engagement step being provided; a plurality of long members for suspending the clamping body; and a flexible mechanism used for absorbing the dimensional discrepancy induced by length dispersion among the plural long members and the dimensional discrepancy induced by an offset in the points clamped by the clamping body on the engagement step and the flexible mechanism being provided with plural pulleys whose rotational axes are not coaxial with one another.

A typical example in conformity with the concept of (5) is shown in FIGS. 21A, 21B and 21C. In this case, the plate body 55 is equivalent to the seesaw member. Typical examples for the above (7) and (8) are shown in FIGS. 22A, 22B and 22C. In this case, the plate bodies 55 and 55' are equivalent to the seesaw members.

(12) an apparatus for producing a single crystal, the device forming a engagement step in the single crystal remaining in a pulled state by the CZ method and suspending the single crystal with the aid of the engagement step, the device comprising a clamping body used for clamping the engagement step and a plurality of long members for suspending the clamping body; characterized in that: during clamping the engagement step, the contact portion of the clamping body is constructed by a sacrifice member capable of deforming to fit the outer periphery of the engagement step.

(13) An apparatus for producing a single crystal as described in (12) characterized in that: the sacrifice member is exchangeable and capable of being affixed or detached freely.

(14) An apparatus for producing a single crystal as described in (13) characterized in that: the sacrifice member is provided with plural protrusion elements extending toward the engagement step.

(15) An apparatus for producing a single crystal as described in (13) characterized in that: the sacrifice member is provided with a sacrifice space that gets narrower during deforming of the sacrifice member.

(16) An apparatus for producing a single crystal as described in (15) characterized in that: the sacrifice space is a hole divergent in a direction substantially perpendicular to the deformation direction of the sacrifice member.

(17) An apparatus for producing a single crystal as described in (13) characterized in that: the sacrifice member is constructed by a bar-shaped body.

(18) An apparatus for producing a single crystal as described in (17) characterized in that: the bar-shaped body is consisted of a metal tube and carbon material packed within the metal tube.

(19) An apparatus for producing a single crystal as described in (18) characterized in that: the metal tube is a stainless tube and the carbon material is carbon fibers, graphite material, or carbon-fiber-reinforced carbon.

The carbon-fiber-reinforced carbon is a compound material whose carbon matrix is reinforced by carbon fibers. This carbon-fiber-reinforced carbon maintains a high strength sufficient for constructing structural members even at a temperature above 1500° C. It can be bought by the trade name "C-C composite" and it has been employed on space shuttles these days.

As described in the subsequent (20), it is also acceptable to appropriately combine those described in (1)–(11) with those described in (12)–(19).

(20) An apparatus for producing a single crystal, which forming a engagement step in the single crystal remaining in a pulled state by the CZ method and suspending the single crystal with the aid of the engagement step, which comprising: a clamping body used for clamping the engagement step, and at least two contact points in contact with the engagement step being provided; a plurality of long members for suspending the clamping body; and a flexible mechanism having a first flexible member capable of tilting even that the single crystal is being clamped by the clamping body and/or a second flexible member capable of tilting even that the clamping body is being suspended by long members; characterized in that: during clamping the engagement step, the contact portion of the clamping body is constructed by a sacrifice member capable of deforming to fit the outer periphery of the engagement step.

BRIEF DESCRIPTION OF THE DRAWINGS

The present invention will become more fully understood from the detailed description given hereinbelow and the accompanying drawings, given by way of illustration only and thus not intended to limit the present invention.

FIGS. 21A, 21B, and 21C are schematic illustrations for explaining the basic principle of this invention, wherein FIG. 21A is a perspective view, FIG. 21B is a side view along X-axis, and FIG. 21C is a side view along Y-axis;

FIGS. 22A, 22B, and 22C are schematic illustrations for explaining the basic principle in the event of overlapping two flexible mechanisms shown in FIGS. 21A, 21B, and 21C, wherein FIG. 22A is a perspective view, FIG. 22B is a side view along X-axis, and FIG. 22C is a side view along Y-axis;

FIGS. 23A, 23B, 23C, 23D, and 23E are schematic illustrations for explaining the basic principle of a flexible mechanism employing pulleys, wherein FIG. 23A is used for explaining the nullification of impertinent situations of upper long members, FIG. 23B is used for explaining the nullification of impertinent situations of lower long members, FIG. 23C is used for explaining the basic principle of a flexible mechanism consisting of two pulleys, and FIG. 23D is a side view of the flexible mechanism shown in FIG. 23C;

FIGS. 24A, 24B, and 24C are schematic illustrations for explaining the basic principle of a flexible mechanism employing a spring, wherein FIG. 24A is a perspective view, FIG. 24B is a side view along Y-axis, and FIG. 24C is a top view;

FIGS. 25A and 25B are schematic illustrations for explaining the basic principle of a flexible mechanism employing an infinity sliding ball-spline, wherein FIG. 25A is a side cross-sectional view and FIG. 25B is a top view;

FIGS. 27A and 27B are schematic illustrations showing the state of the fifth embodiment according to this invention before applying a load thereon, wherein FIG. 27A is a cross-sectional view along line A—A of FIG. 27B;

FIGS. 28A and 28B are schematic illustrations showing the state of the fifth embodiment according to this invention after applying a load thereon, wherein FIG. 28A is a cross-sectional view along line A—A of FIG. 28B;

FIGS. 29A, 29B, 29C, and 29D are schematic illustrations showing a variety of alternative examples for the bar-shaped body of the fifth embodiment according to this invention;

FIGS. 32A and 32B are schematic illustrations showing the state of the eighth embodiment according to this invention before applying a load thereon, wherein FIG. 32A is a cross-sectional view along line A—A of FIG. 32B;

FIGS. 33A and 33B are schematic illustrations showing the state of the eighth embodiment according to this invention after applying a load thereon, wherein FIG. 33A is a cross-sectional view along line A—A of FIG. 33B;

FIGS. 34A and 34B are schematic illustrations showing the state of the ninth embodiment according to this invention before applying a load thereon, wherein FIG. 34A is a cross-sectional view along line A—A of FIG. 34B; and FIGS. 35A and 35B are schematic illustrations showing the state of the ninth embodiment according to this invention after applying a load thereon, wherein FIG. 35A is a cross-sectional view along line A—A of FIG. 35B.

DETAILED DESCRIPTION OF THE INVENTION

The following is a description, with reference to the drawings, of embodiments of an apparatus for producing a single crystal according to this invention.

Figure 1:
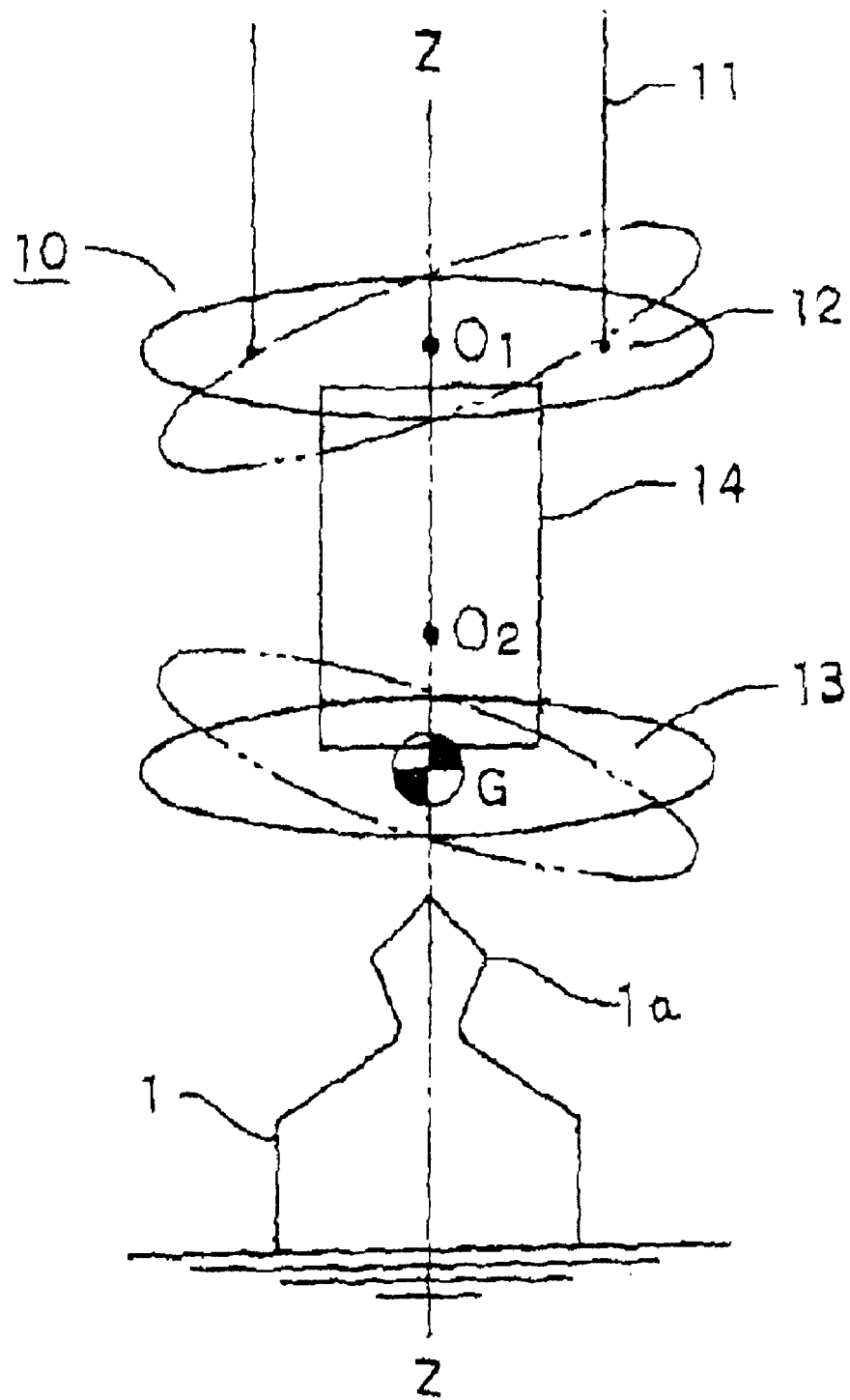
FIG. 1 is a schematic illustration showing the concept of the clamping device employed in the device for pulling single crystals according to this invention.

FIG. 1 is a schematic illustration showing the concept of a clamping body for pulling a single crystal. A clamping body 10 is vertically moved by a clamping body raising/lowering means (which employs a plurality of wires; for example, three wires 11 in the present embodiment) which vertically moves the clamping body 10 in association with pull of a single crystal. Wire connectors 12 (herein, wires correspond to raising/lowering means) are separated from a clamping member connector 13 (hereinafter referred to as a "retaining section") to which claws for retaining an engagement step 1a of a single crystal 1. A coupling member 14 is interposed between the wire connectors 12 and the retaining section 13. The wire connectors 12 of the wires and the retaining section 13 are capable of respectively tilting around two omidirectional tilt centers $O_1$, $O_2$ independently in all directions. The two omidirectional tilt centers $O_1$, $O_2$ are located at the rotation axis Z-Z of the single crystal. Furthermore, the omidirectional tilt center $O_1$ is substantially located at the geometric center of the engaging points of wires 11. The omidirectional tilt center $O_2$ is substantially located at or above the intersecting point G of the plane containing the crystal clamping points of the retaining section 13 and the rotation axis of the crystal. The omidirectional tilt center $O_1$ has a function of absorbing length dispersion induced by a variation in extension of the wires 11, and the omidirectional tilt center $O_2$ has a function of amending the tilting of the single crystal 1 clamped in a tilted attitude.

It is not required to arrange engaging members to tilt in all directions if two wires 11 are used and $O_1$ is located at the tilting center of the engaging members which tilt around the axis perpendicular to the plane containing the two wires 11. If a shaft type clamping body is used as a raising/lowering means instead of wires; then a variation in extension of the shaft type clamping body is small enough to be ignored. Therefore, the omidirectional tilt center $O_1$ can be omitted.

Figure 2:
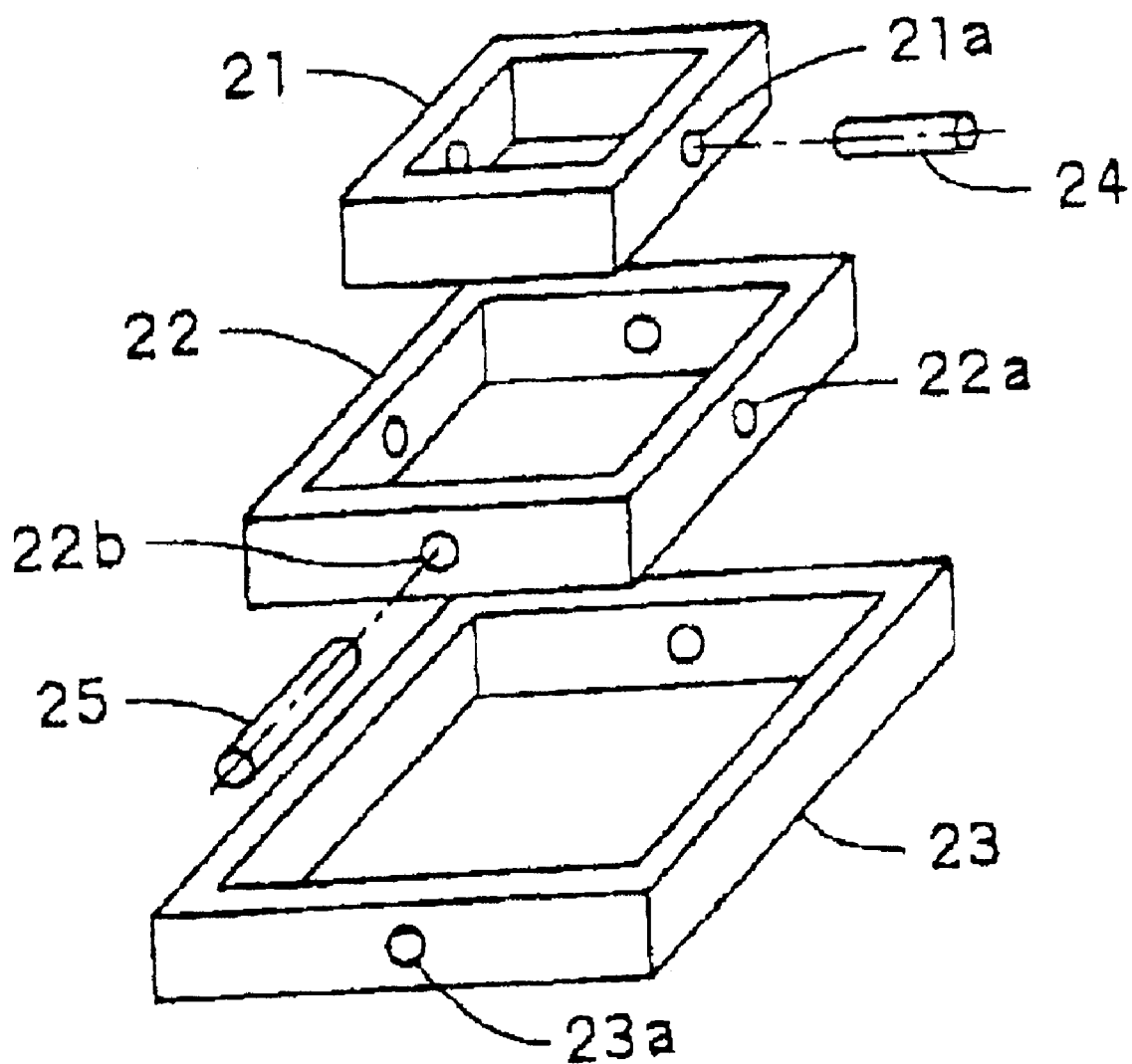
FIG. 2 is a perspective view showing the shapes of structure members in an example for establishing an omidirectional tilt center.

FIG. 2 shows a concrete example for establishing an omidirectional tilt center. The frame member 21 is accommodated within the frame member 22 with a preset clearance existing therebetween, and the frame member 22 is accommodated within the frame member 23 in the same manner. Two pairs of pinholes 21a, 23a are respectively formed in the opposite side segments of the frame members 21 and 23. Furthermore, one pair of pinholes 22a are formed in two opposite side segments of the frame member 22, and the other pair of pinholes 22b are formed in the other two opposite side segments of the frame member 22. The pins 24 are inserting through the pinholes 21a of the frame member 21 and the pinholes 22a of the frame member 22, and the pins 25 are inserting through the pinholes 22b of the frame member 22 and the pinholes 23a of the frame member 23. By this arrangement, the frame members 21, 22 and 23 can be fabricated into one integral body (see FIG. 3).

Figure 3:
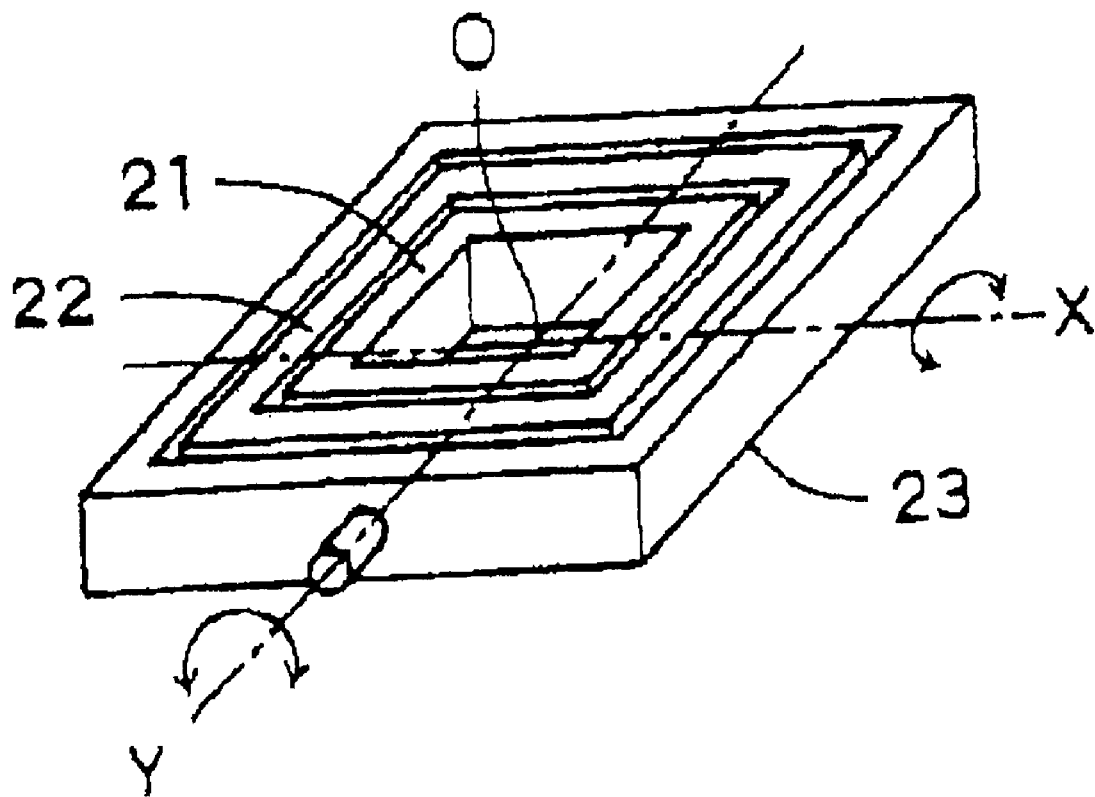
FIG. 3 is a perspective view showing the assembled omidirectional tilt center shown in FIG. 2.

As shown in FIG. 3, the frame member 21 is capable of swaying around the axes of the pins 24 (namely, X-axis) with respect to the frame member 23, and the frame member 22 is capable of swaying around the axes of the pins 28 (namely, Y-axis) with respect to the frame member 23. By this arrangement, the frame member 21 is capable of swaying around X-axis and Y-axis with respect to the frame member 23.

Figure 4:
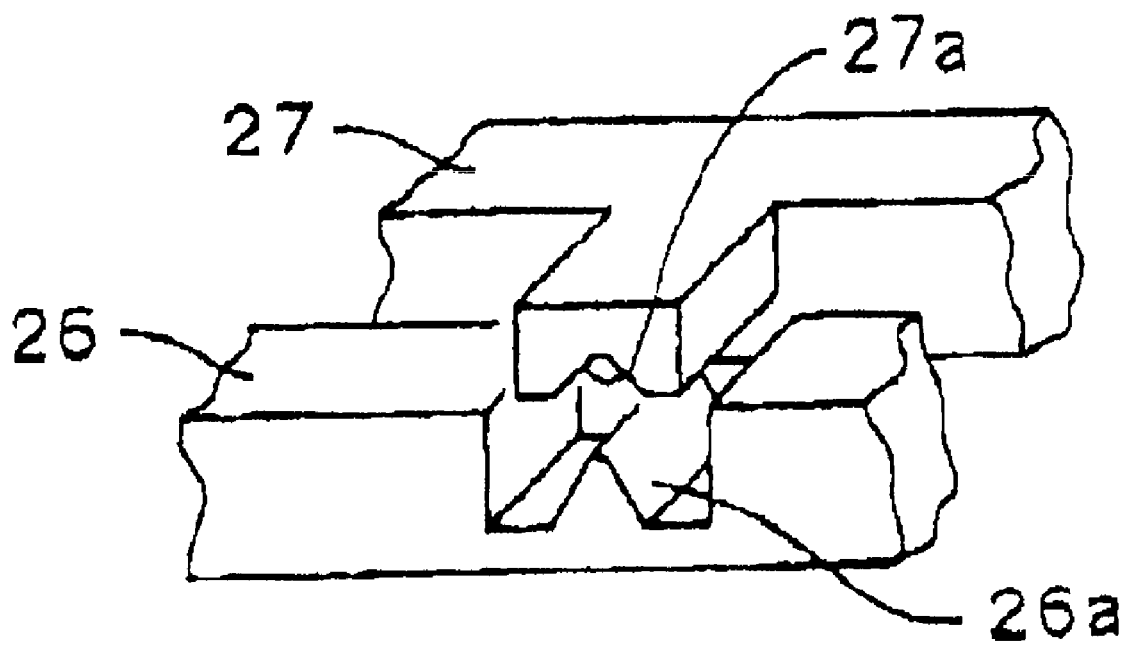
FIG. 4 is a perspective view showing the structure for constructing one axis of an omidirectional tilt center according to another example.

In FIG. 3, the omidirectional tilt center O is located at the intersecting point of X-axis and Y-axis. In order to keep the swaying of the frame members in a smooth way, it is also acceptable to dispose bearings between the pins 24 and the pinholes 21a, 22a; and between the pins 25 and the pinholes 22b, 23a. Furthermore, it is also satisfactory to conduct the swaying of the frame members without engaging the pins with the pinholes. For example, as shown in FIG. 4, two protrusions 26a, having acute apexes, are respectively formed on one pair of opposite side segments of a frame member 26; and two arms 27a, having recesses 27a with recessed angles larger than the acute angles of the protrusions 26a, extend outward respectively from one pair of opposite side segments of a frame member 27. By assembling the frame member 26 and the frame member 27, the swaying movement between the frame members could be made.

Two mechanisms, for instance, shown in FIG. 2 are employed to perform the swaying around the omidirectional tilt centers $O_1$ and $O_2$ shown in FIG. 1. Namely, the frame members 23 (or frame members 21) are connected to the coupling member 14, and the remaining frame members 21 (or frame member 23) are respectively connected to wires (or rigid members) and the clamping member. Furthermore, in the embodiment shown in FIG. 1, the omidirectional tilt centers $O_1$ and $O_2$ can respectively operate solely. However, if a specific geographical relationship between the omidirectional tilt centers $O_1$ and $O_2$ is achieved, they can be merged into a single one. Namely, if the omidirectional tilt centers are substantially located at the crystal rotation axis and at the geometric center of the wire connectors 12 of wires, and the omidirectional tilt centers are substantially located at or above the intersecting point of the plane containing the crystal clamping points of the engaging portions and the rotation axis of the crystal; then the two omidirectional tilt centers can be merged into a single one.

Figure 5:
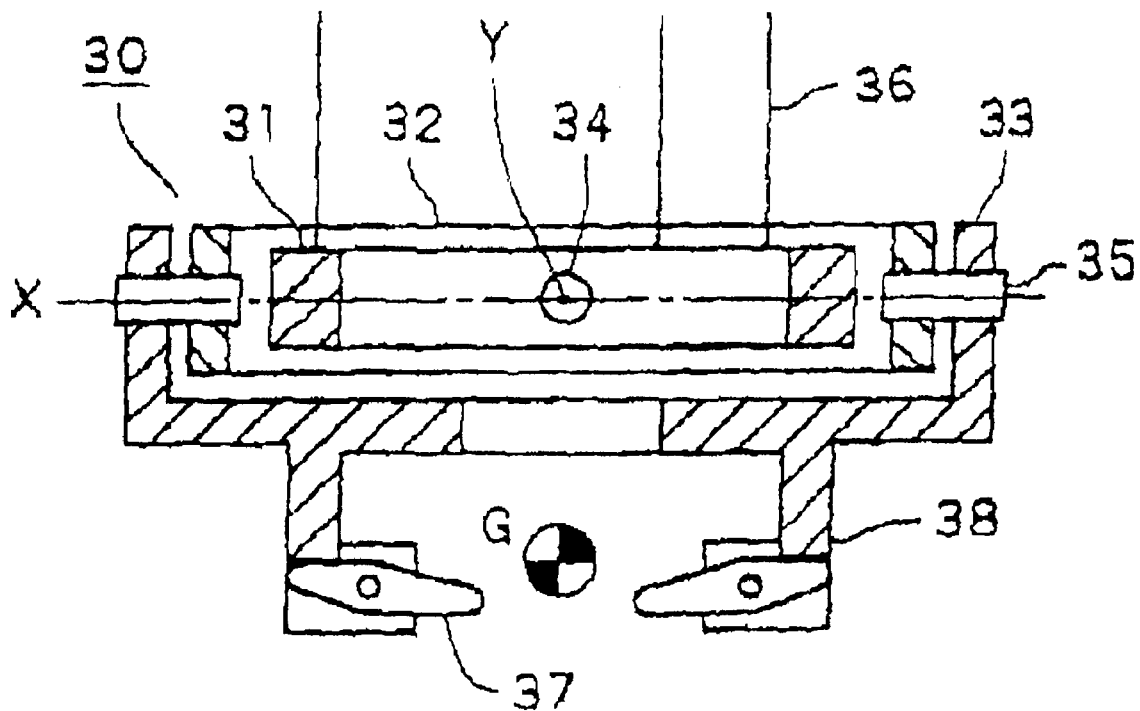
FIG. 5 is a cross-sectional view of a clamping device according to the first embodiment of this invention.

FIG. 5 is a cross-sectional view of a clamping body according to the first embodiment, which satisfies the above condition. The clamping body 30, which is substantially the same as that shown in FIG. 2, is consisted of three ring-shaped frame members 31, 32 and 33. The frame member 31 is pivotally supported within the frame member 32 by a pin 34 in a manner capable of tilting without any restraint, and the frame member 32 is pivotally supported within the frame member 33 by a pin 35 in a manner capable of tilting freely. Three wires 36 are engaging on the top surfaces of the frame member 31, and a clamping portion 38 having a plurality of claws 37 is integrally formed with the frame member 33. The omidirectional tilt center is located at the intersecting point of the central axis Y of the pin 34 and the central axis X of the pin 35. The length dispersion between the wires 36 could be absorbed and the tilting of the single crystal could be amended by only one omidirectional tilt center. Moreover, it is also satisfactory to devise the shape and function of the claws 37 the same as those of conventional clamping bodies.

Figure 6:
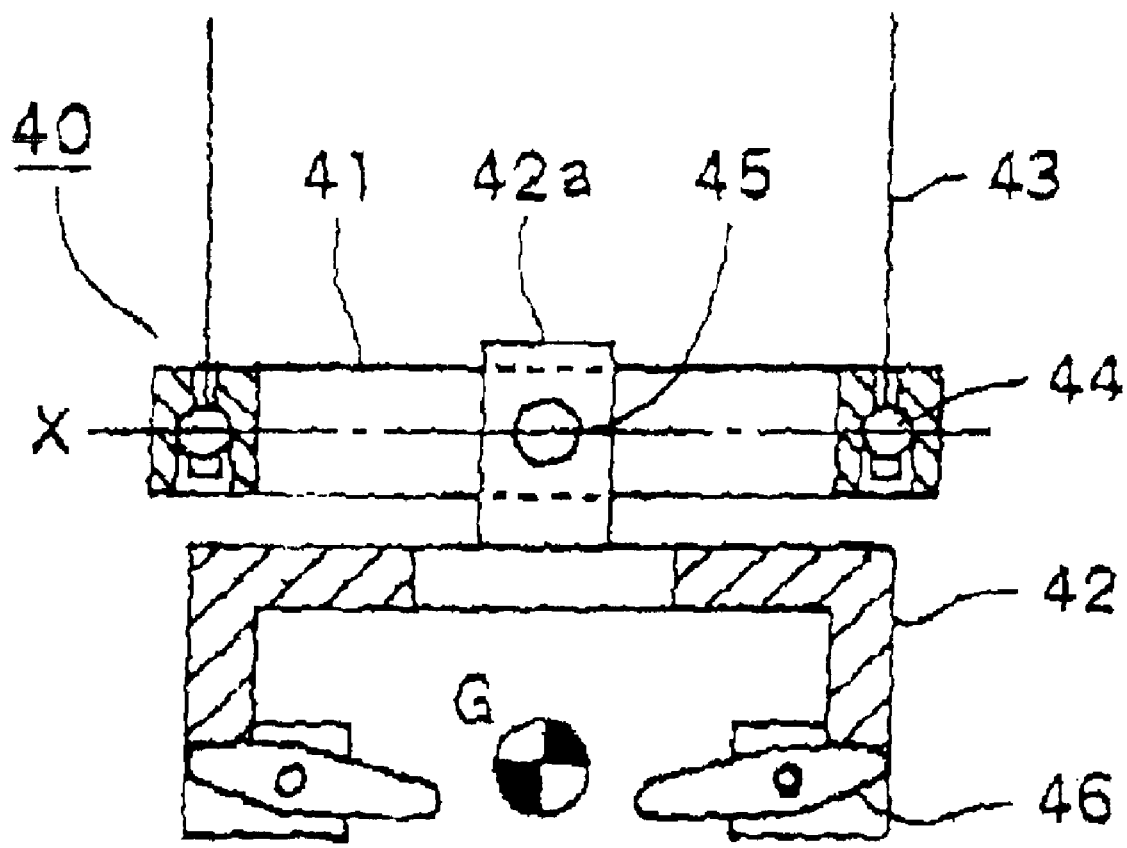
FIG. 6 is a cross-sectional view of a clamping device according to the second embodiment of this invention.
Figure 7:
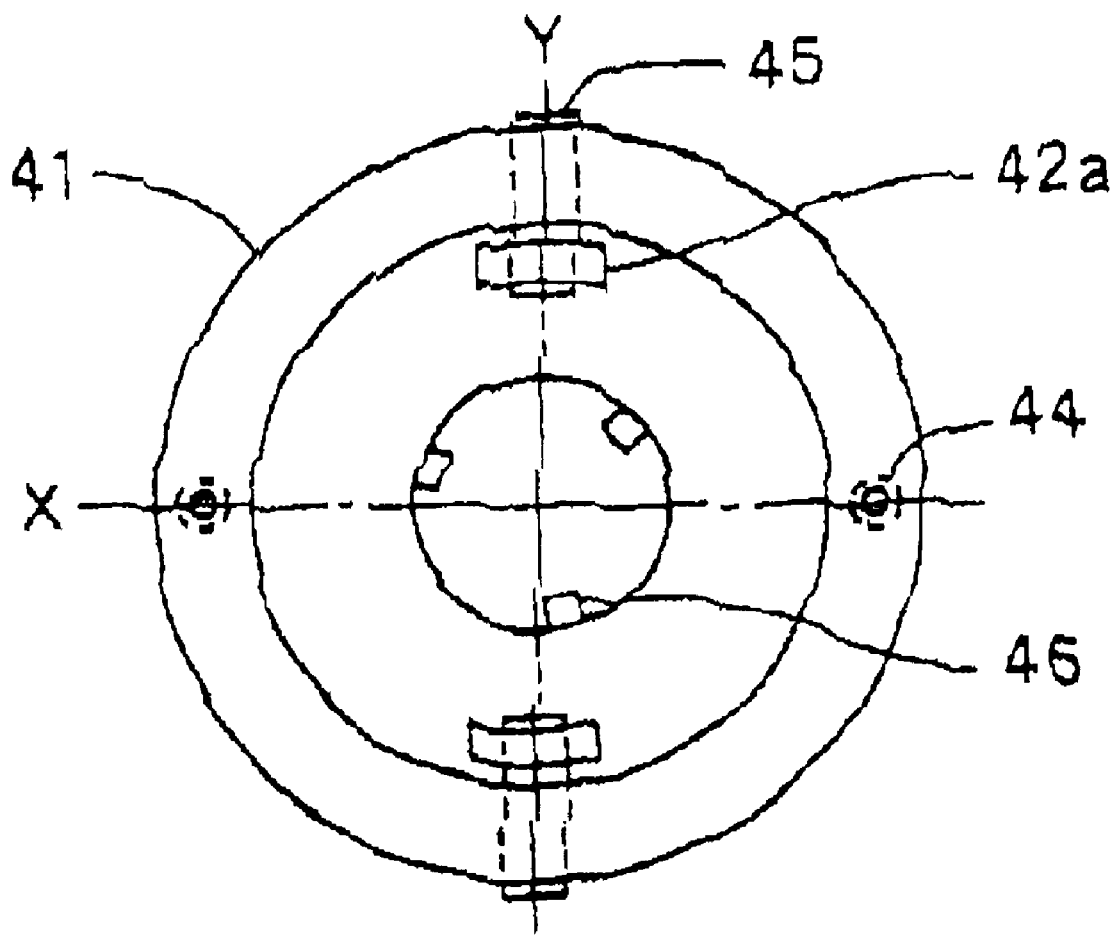
FIG. 7 is a top view of the clamping device shown in FIG. 6.

FIGS. 6 and 7 show a clamping device according to the second embodiment, which possesses one omidirectional tilt center. The clamping body 40 is composed of a ring-shaped frame member 41 and a clamping portion 42. Two shank-balls 44 having spherical surfaces are disposed at the ends of the two wires 43, which suspend the clamping body 40. The two shank-balls 44 are accommodated within two engaging cavities formed in the frame member 41. By this arrangement, the frame member 41 is capable of tilting without any restraint around the X-axis passing through the centers of the two shank-balls 44. Furthermore, one pair of protrusions 42a, 42a extending upward are formed on the outer rim of the upper surface of the clamping portion 42. The protrusions 42a, 42a are connected with the frame member 41 via two pins 45, 45. By this arrangement, the clamping portion 42 is capable of tilting without any restraint around the Y-axis passing through the axes of the two pins 45, 45. It is also satisfactory to devise the shape and function of the claws 46 the same as those of conventional clamping bodies.

The clamping body 40 can be raised or lowered by two wires 43, 43. A variation in extension of the wires 43, 43 could be absorbed by tilting of the frame member 41 around Y-axis; therefore tilting of the clamping portion 42 can be avoided. Furthermore, inclination of the single crystal being clamped can be amended by tilting of the clamping portion 42 around X and Y axes toward the intersecting point of the X-axis and Y-axis, namely the rotation axis of the crystal.

The above embodiment shows that a rigid member can act as means for correcting the inclination of a single crystal in a retained state even in the case of an ingot manufacturing apparatus of shaft type.

The following is a description of the third embodiment with reference to FIGS. 8–13.

Figure 8:
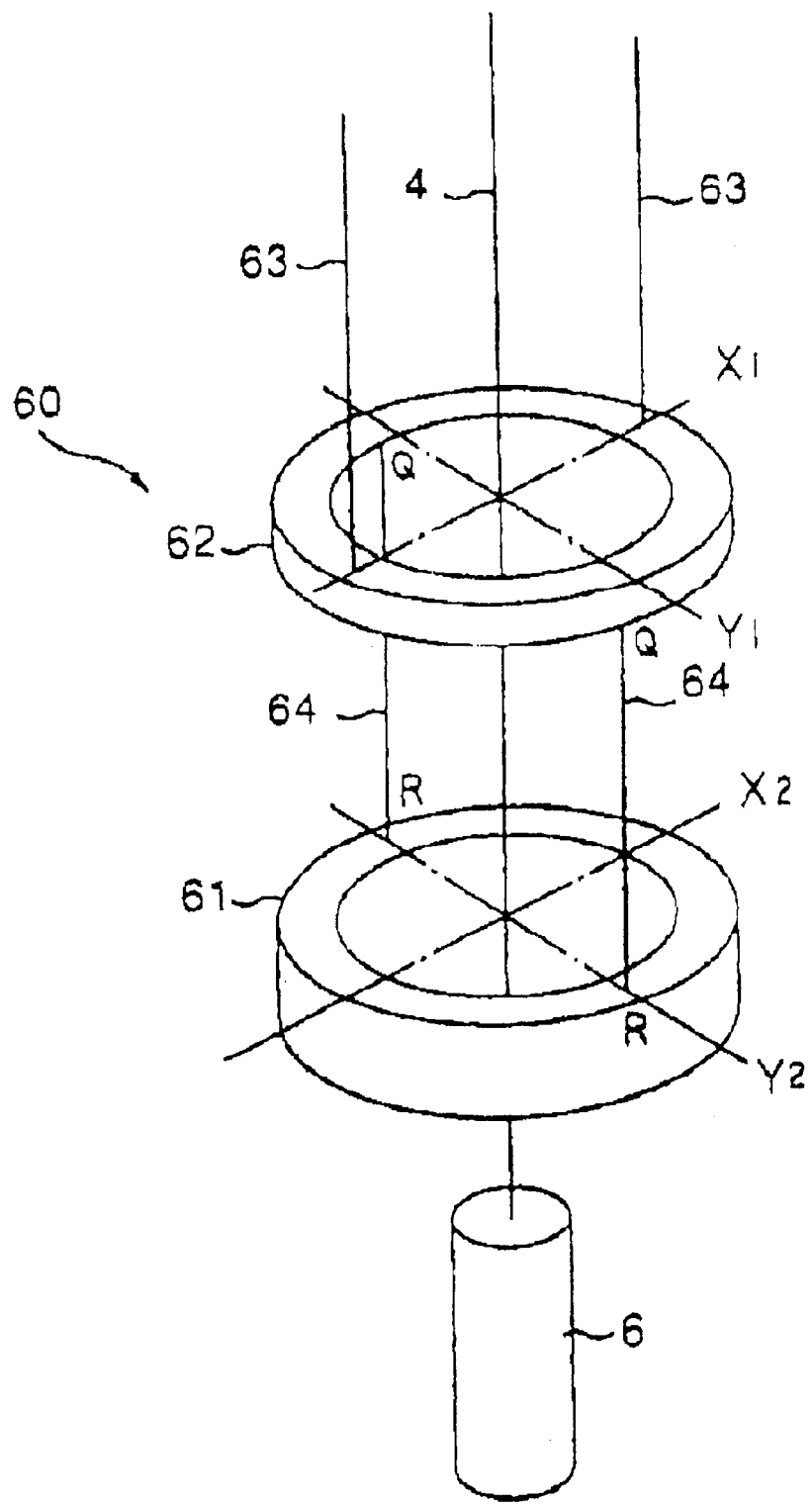
FIG. 8 is a perspective view showing a clamping device for pulling single crystals according to the third embodiment of this invention.
Figure 9:
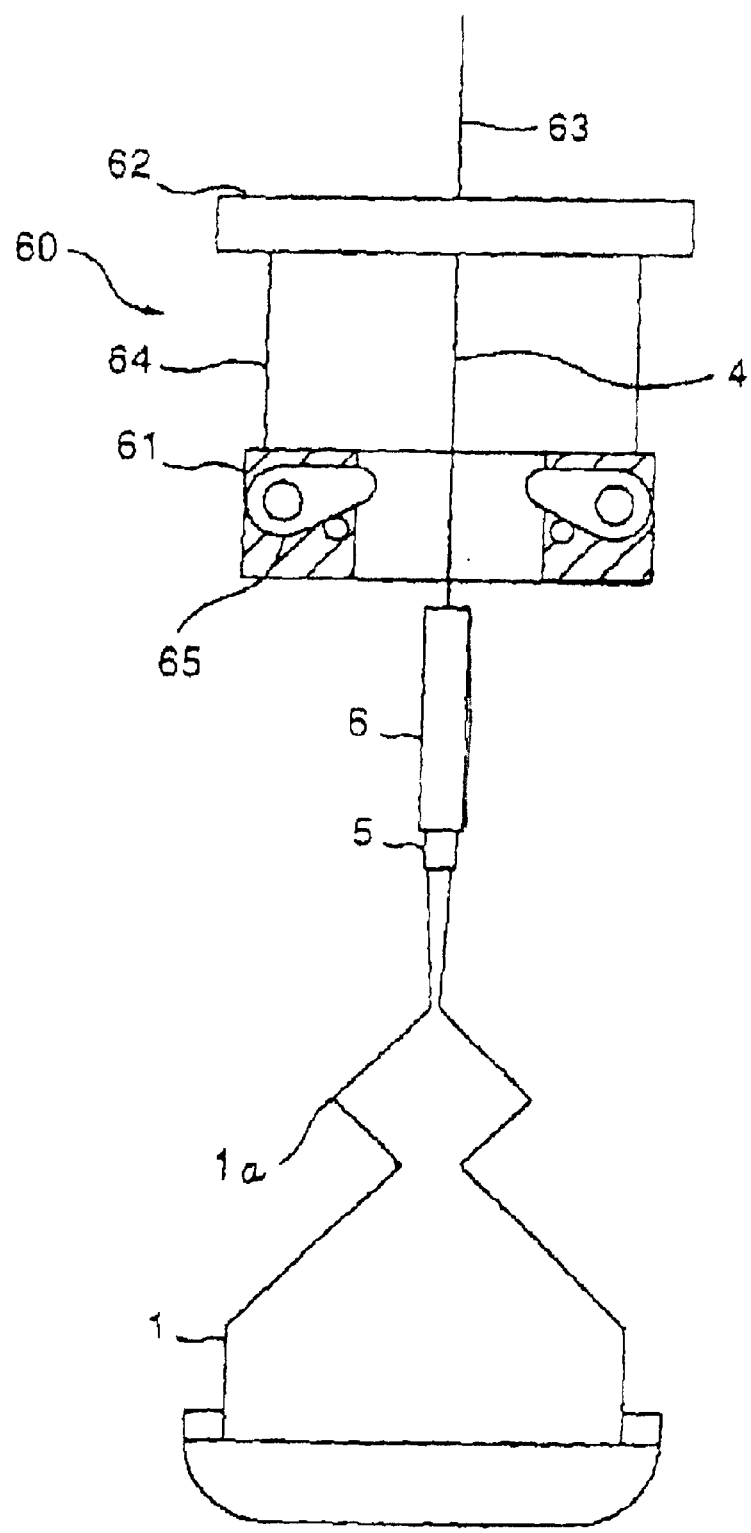
FIG. 9 is a side view showing the clamping device shown in FIG. 8, with cross-sectional portions therein.

FIG. 8 is a perspective view showing a clamping device for pulling single crystals according to the third embodiment. FIG. 9 is a side view showing the clamping device shown in FIG. 8, with cross-sectional portions therein. The clamping body 60 comprises a frame member 61 having clamping portions therein; a coupling frame member 62 connecting with one pair of wires 63, 63; and one pair of coupling wires 64, 64 for connecting the frame member 61 and the coupling frame member 62. The line X1 (hereinafter referred as axis X1) connecting the engaging points of the wires 63, 63 and the coupling frame member 62 is perpendicular to the line Y1 (hereinafter referred as axis Y1) connecting the engaging points of the coupling wires 64, 64 and the coupling frame member 62. Furthermore, the frame member 61 has a line Y2 (hereinafter referred as axis Y2) connecting the engaging points of the coupling wires 64, 64 and the frame member 61, and an axis X2 perpendicular to the axis Y2. The detailed description of the axes X1, X2, Y1, and Y2 will be disclosed below.

Plural claws 65 for clamping use are disposed on the inner peripheral wall of the frame member 61 in a manner capable of swaying freely within a preset angular range. A seed chuck 6 is suspended by a crystal pulling wire 4, which passes through the central openings of the coupling frame member 62 and the frame member 61. Furthermore, a seed crystal 5 is installed within the lower portion of the seed chuck 6, and the single crystal 1 is grown with the aid of the seed crystal 5. In addition, a engagement step 1a is formed on the upper portion of the single crystal 1. The above plural claws 65 are conducted to engage with the engagement step 1a so as to clamp the single crystal 1. Furthermore, in this embodiment, the coupling frame member 62 and the frame member 61 are in the shape of a circular ring. However, the present invention is not limited to the above-described embodiment.

Figure 10:
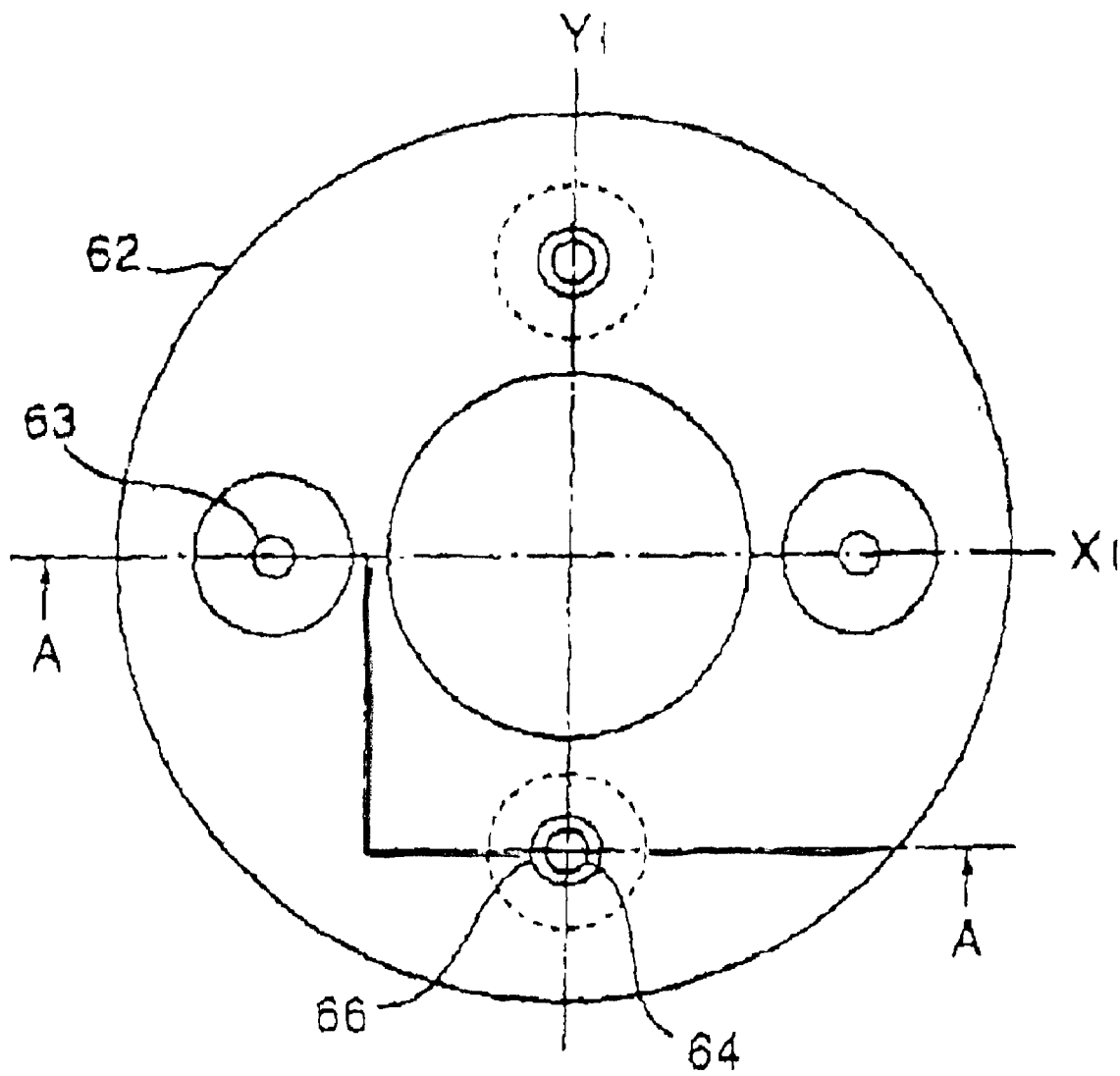
FIG. 10 is a top view showing a coupling frame member according to the third embodiment of this invention.
Figure 11:
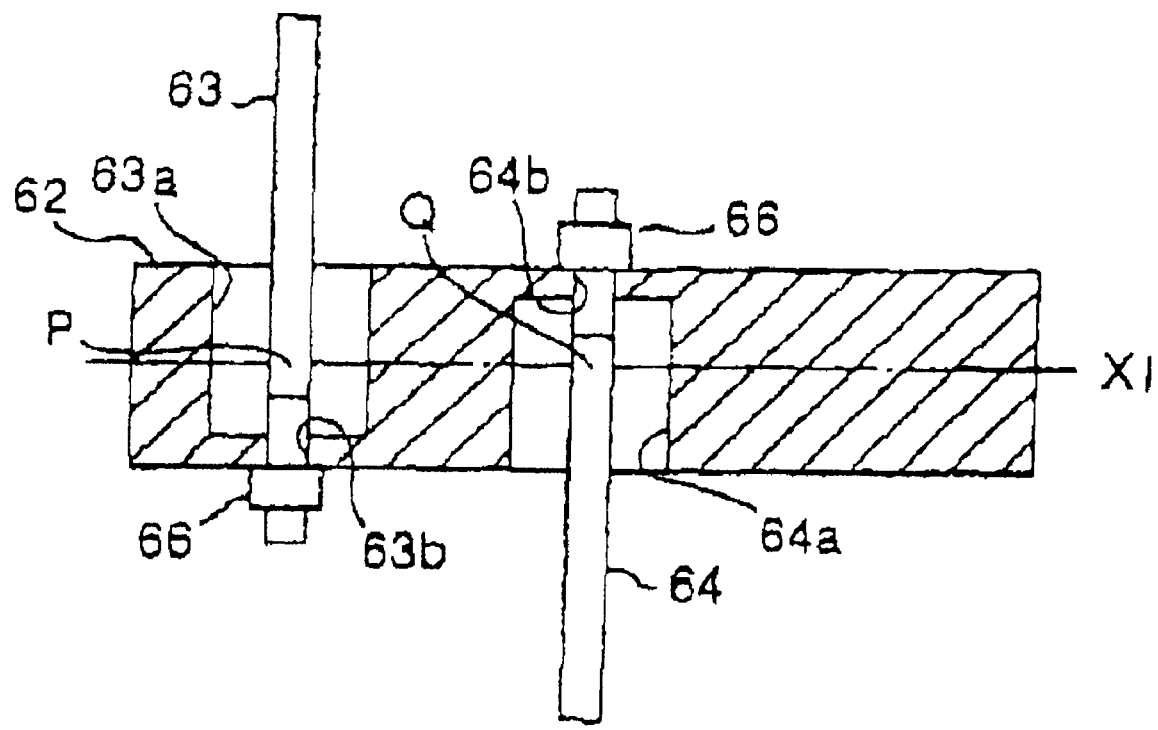
FIG. 11 is a cross-sectional view along line A—A of FIG. 10.

FIG. 10 is a top view showing the coupling frame member 62. FIG. 11 is a cross-sectional view along line A—A of FIG. 10. As shown in FIG. 11, two engaging holes 63a, 63a having diameters larger than those of the wires 63, 63 are formed at the joints of the coupling frame member 62 and the wires 63, 63. The openings of the engaging holes 63a, 63a are extending through the top surface of the coupling frame member 62, and two through holes 63b, 63b having substantially the same diameters as those of the wires 63, 63 are extending through the bottom of the engaging holes 63a, 63a. Furthermore, two engaging holes 64a, 64a having diameters larger than those of the coupling wires 64, 64 are formed at the joints of the coupling frame member 62 and the coupling wires 64, 64. The openings of the engaging holes 64a, 64a are extending through the bottom surface of the coupling frame member 62, and two through holes 64b, 64b having substantially the same diameters as those of the coupling wires 64, 64 are formed in the upper portion of the engaging holes 64a, 64a. The lower ends of the wires 63, 63 are extending through the engaging holes 63a, 63a and the through holes 63b, 63b and are engaged at the bottom surface of the coupling frame member 62 with two engaging members 66. Furthermore, the upper portion of the coupling wires 64, 64 are extending through the engaging holes 64a, 64a and the through holes 64b, 64b and are engaged at the top surface of the coupling frame member 62 with two engaging members 66. Due to that the wires 63, 63 are capable of bending at bending points P, P, which are located within the engaging holes 63a, 63a and located above the engaging members 66, 66 (which are engaging with the lower ends of the wires 63, 63) by a preset distance; therefore an axis X1 connecting the bending points P, P is equivalent to a tilting axis. Similarly, the coupling wires 64, 64 are capable of bending at bending points Q, Q, which are located within the engaging holes 64a, 64a and above the engaging members 66, 66 (which are engaging with the upper ends of the coupling wires 64, 64) by a preset distance; therefore an axis Y1 connecting the bending points Q, Q is equivalent to a tilting axis.

Figure 12:
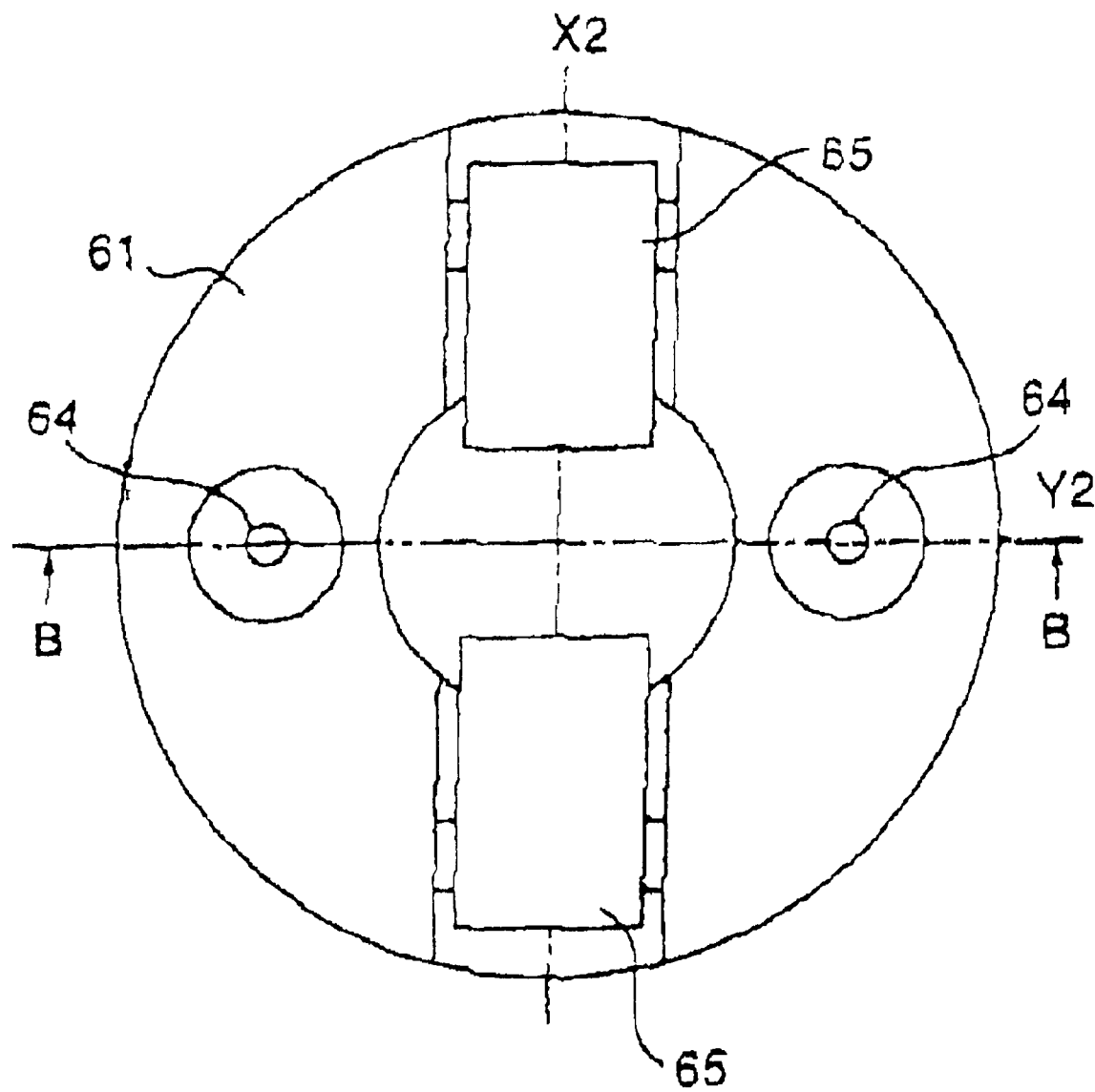
FIG. 12 is a top view showing a frame member according to the third embodiment of this invention.
Figure 13:
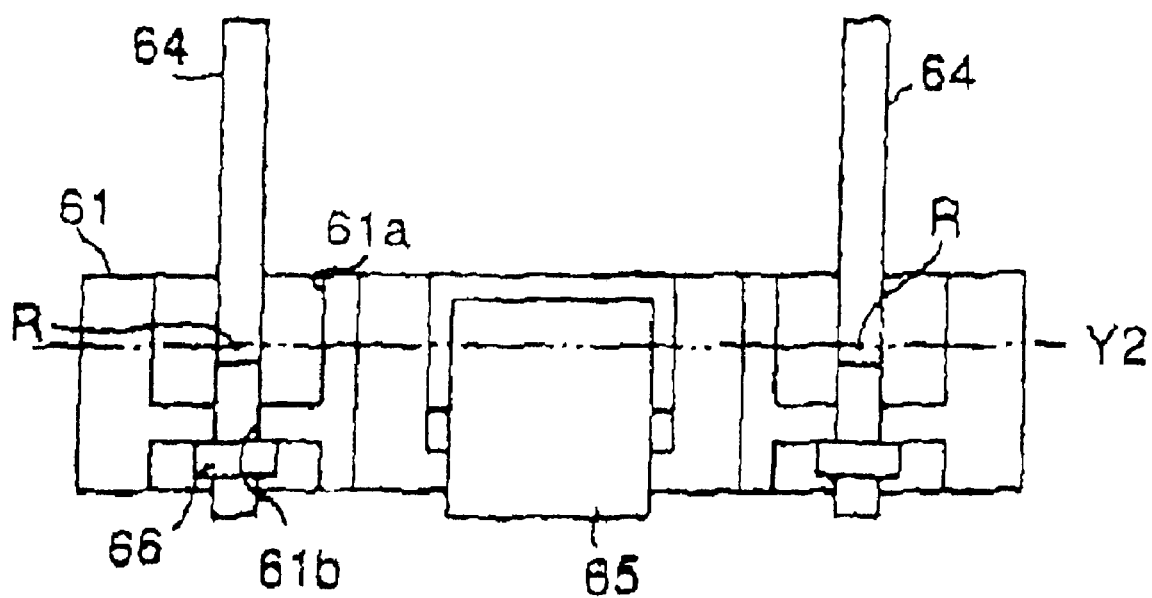
FIG. 13 is a cross-sectional view along line B—B of FIG. 12.

FIG. 12 is a top view showing the frame member 61. FIG. 13 is a cross-sectional view along line B—B of FIG. 12. As shown in FIGS. 12 and 13, two engaging holes 61a, 61a having diameters larger than those of the coupling wires 64, 64 are formed at the joints of the frame member 61 and the coupling wires 64, 64. The openings of the engaging holes 61a, 61a are extending through the top surface of the frame member 61, and two through holes 61b, 61b having substantially the same diameters as those of the coupling wires 64, 64 are extending through the bottom of the engaging holes 61a, 61a. The lower ends of the coupling wires 64, 64 are extending through the engaging holes 61a, 61a and the through holes 61b, 61b and are engaged at the bottom surface of the frame member 61 with two engaging members 66. Due to that the coupling wires 64, 64 are capable of bending at bending points R, R, which are located within the engaging holes 61a, 61a and located above the engaging members 66, 66 (which are engaging with the lower ends of the coupling wires 64, 64) by a preset distance; therefore the axis Y2 connecting the bending points R, R is equivalent to one tilting axis.

According to the structure of this invention, the coupling frame member 62 and the frame member 61 are connected by one pair of coupling wires 64, 64; therefore the coupling frame member 62 is capable of tilting freely around the axis Y1 connecting the upper bending points Q, Q of the coupling wires 64, 64. Besides, independent of tilting of the coupling frame member 62, the frame member 61 is capable of tilting freely around the axis Y2 connecting the lower bending points R, R of the coupling wires 64, 64. Furthermore, the coupling frame member 62 is capable of tilting freely around the axis X1, which is perpendicular to Y1 axis and connecting the bending points P, P of the wires 63, 63. Moreover, the titling of the coupling frame member 61 around the axis X2, which is perpendicular to the above axis Y2, is converted into tilting around the axis X1 through the movement of a parallel-quadric-linkage mechanism, whose joints are located at the upper bending points Q, Q (the coupling frame member 62 side) and the lower bending points R, R (the frame member 61 side) respectively.

Therefore, if any elongation dispersion during heavy load or length dispersion between the wires 63, 63 occurs, then the coupling frame member 62 tilts around the axis Y1.

Accordingly, the length dispersion between the wires 63, 63 could be absorbed so as to avoid inclination of the single crystal 1. Moreover, in the event of clamping the single crystal 1 by the claws 65 of the clamping portion of the frame member 61, if the single crystal 1 is clamped in an inclined attitude, then the frame member 61 will tilt around the axes X2 and Y2. This can avoid inclination of the single crystal 1. As a result, runout of the single crystal 1 can be reduced to a small amount and the poly-crystallization can be eliminated. Thus, productivity of single crystals could be enhanced.

In addition, bending of one pair of wires can equivalently substitute the movement of tilting, thus members used for tilting, such as slide portions and the rotation portions of bearings are not required. By this arrangement, dusts will not be produced and cleanness can be improved during single crystal processes. Moreover, bearing parts is not required, thus the cost can be reduced. The following is a description of the fourth embodiment, with reference made to FIGS. 14–17.

Figure 14:
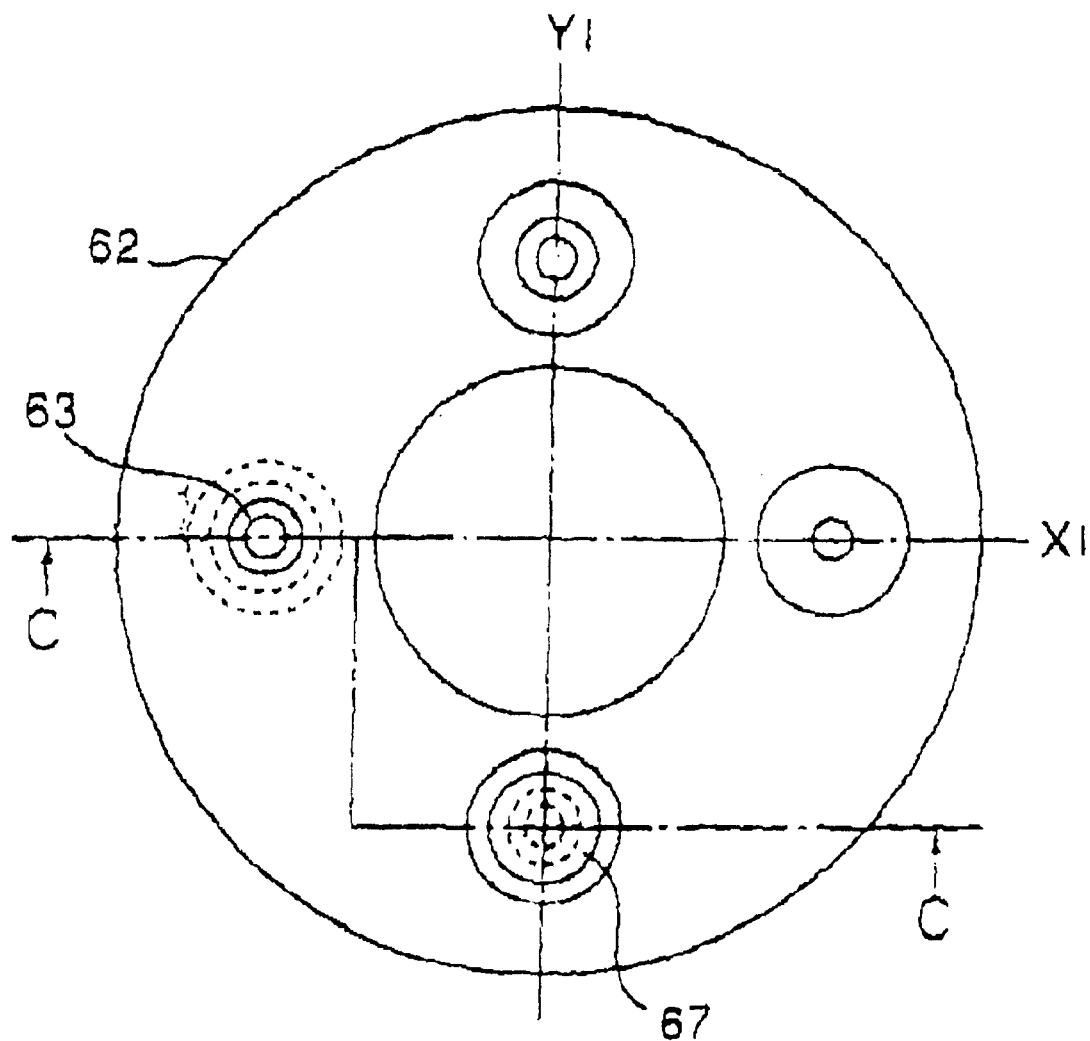
FIG. 14 is a top view showing a coupling frame member according to the fourth embodiment of this invention.
Figure 15:
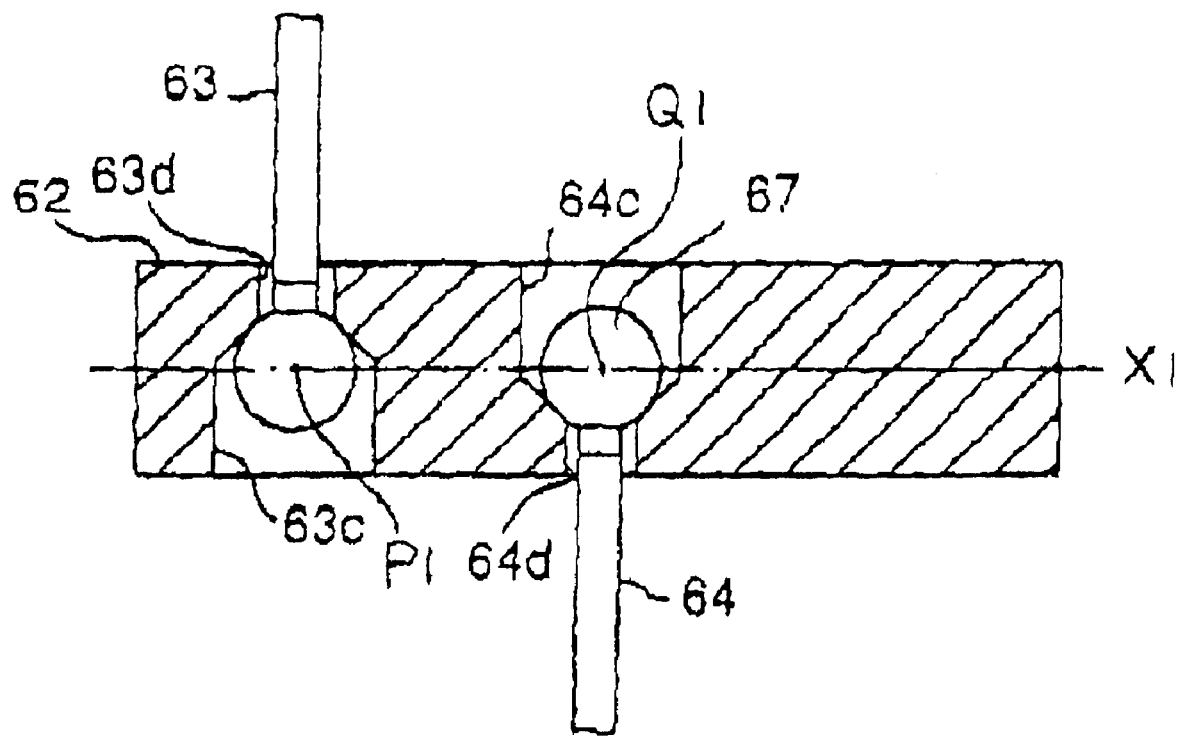
FIG. 15 is a cross-sectional view along line c—c of FIG. 14.

In this embodiment, the structures are substantially the same as those of the third embodiment. The method for engaging wires is different to that of the third embodiment. Only the different structure is explained here. Members having the same structure as those of the third embodiment are designated the same numerals. FIG. 14 is a top view showing a coupling frame member according to the fourth embodiment of this invention. FIG. 15 is a cross-sectional view along line c—c of FIG. 14. Spherical engaging members 67 are respectively installed at the distal ends of the wires 63, 63 and the coupling wires 64, 64. As shown in FIGS. 14 and 15, two engaging holes 63c, 63c having diameters larger than that of the spherical engaging member 67 are formed at the joints of the coupling frame member 62 and the wires 63, 63. The openings of the engaging holes 63c, 63c are extending through the bottom surface of the coupling frame member 62, and two through holes 63d, 63d, having diameters smaller than that of the spherical engaging member 67 and larger than that of the raising/lowering wire 63 by a preset amount, are formed in the upper portions of the engaging holes 63c, 63c. Furthermore, two engaging holes 64c, 64c having diameters larger than that of the spherical engaging member 67 are formed at the joints of the coupling frame member 62 and the coupling wires 64, 64. The openings of the engaging holes 64c, 64c are extending through the top surface of the coupling frame member 62, and two through holes 64d, 64d, having diameters smaller than that of the spherical engaging member 67 and larger than that of the coupling wire 64 by a preset amount, are formed in the lower portions of the engaging holes 64c, 64c. The lower ends of the wires 63, 63 extend through the through holes 63d, 63d and are engaged with the spherical engaging members 67, 67 within the engaging holes 63c, 63c. Similarly, The upper ends of the coupling wires 64, 64 extend through the through holes 64d, 64d and are engaged with the spherical engaging members 67, 67 within the engaging holes 64c, 64c. The axis X1 connecting the centers P1, P1 of the spherical engaging members 67, 67 engaging with the wires 63, 63 and the axis Y1 connecting the centers Q1, Q1 of the spherical engaging members 67, 67 engaging with the coupling wires 64, 64 are respectively employed as tilting axes. Furthermore, the axis X1 is perpendicular to the axis Y1.

Figure 16:
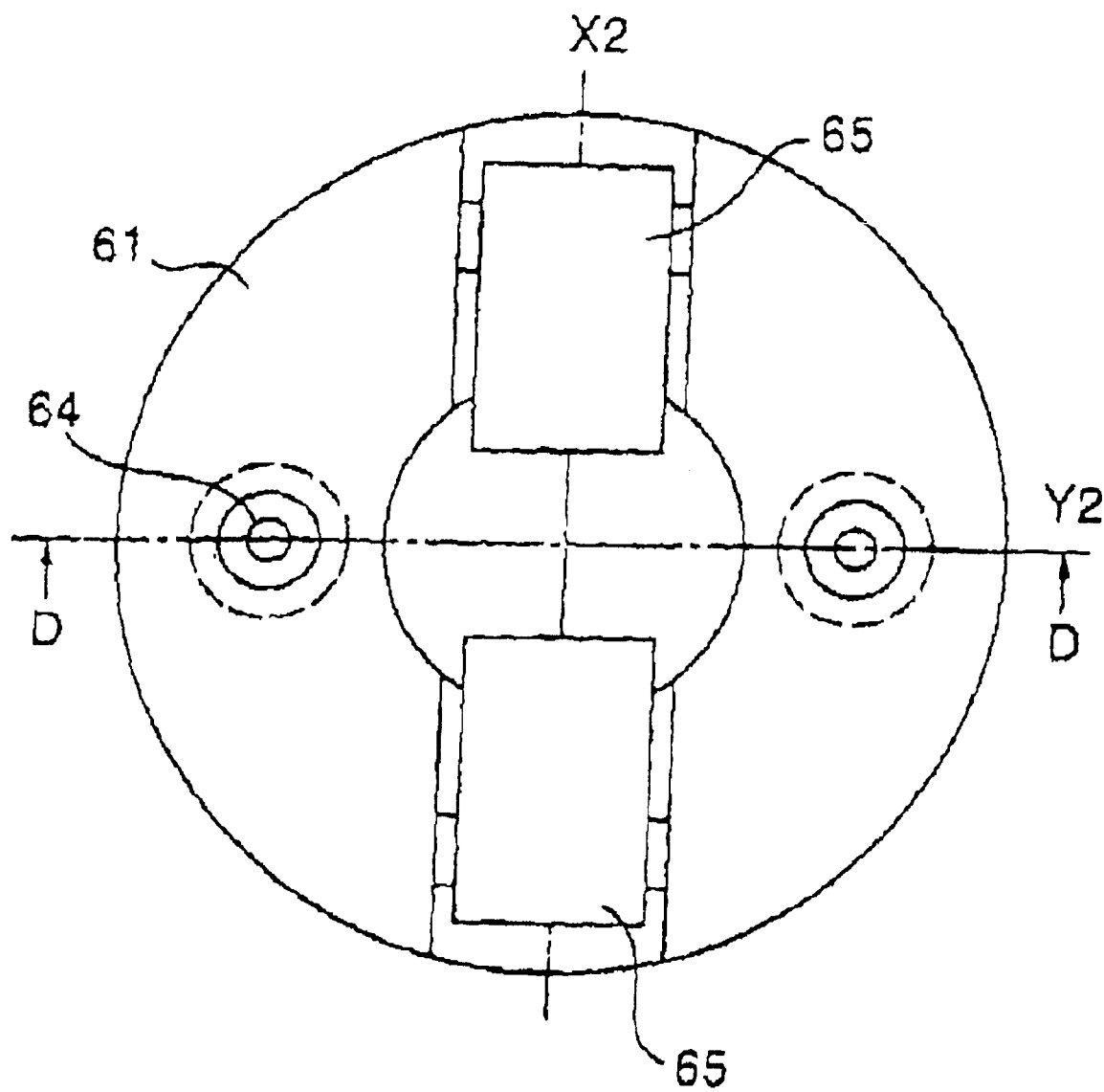
FIG. 16 is a top view showing a frame member according to the fourth embodiment of this invention.
Figure 17:
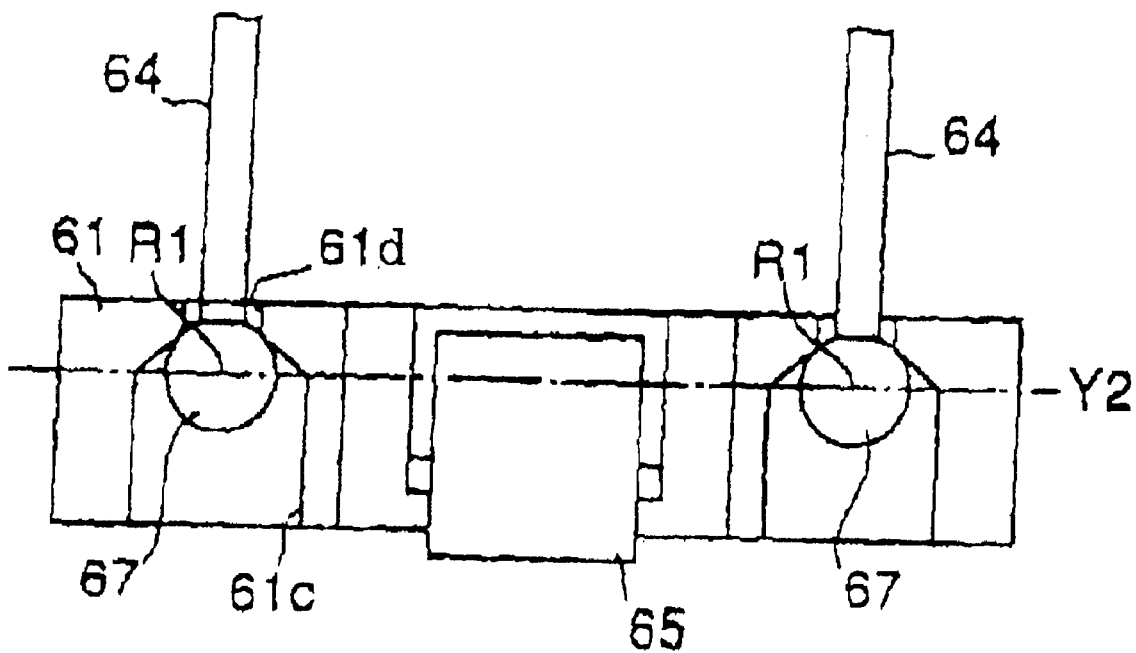
FIG. 17 is a cross-sectional view along line D—D of FIG. 16.

FIG. 16 is a top view showing the frame member according to this embodiment. FIG. 17 is a cross-sectional view along line D—D of FIG. 16. As shown in FIGS. 16 and 17, two engaging holes 61c, 61c having diameters larger than that of the spherical engaging member 67 are formed at the joints of the frame member 61 and the coupling wires 64, 64. The openings of the engaging holes 61c, 61c are extending through the bottom surface of the frame member 61, and two through holes 61d, 61d, having diameters smaller than that of the spherical engaging member 67 and larger than that of the coupling wire 64 by a preset amount, are formed in the upper portions of the engaging holes 61c, 61c. The lower ends of the coupling wires 64, 64 extend through the through holes 61d, 61d are engaged with the spherical engaging members 67, 67 within the engaging holes 61c, 61c. Under this circumstance, the axis Y2 connecting the centers R1, R1 of the spherical engaging members 67, 67 within the engaging holes 61c, 61c is employed as the tilting axis.

The structure of this embodiment is described as above, same to the previous embodiment, the coupling frame member 62 is capable of tilting freely around the axis Y1 connecting the centers Q1, Q1 of the spherical engaging members 67, 67 engaging with the upper ends of the coupling wires 64, 64. Besides, independent of tilting of the coupling frame member 62, the frame member 61 is capable of tilting freely around the axis Y2 connecting the centers R1, R1 of the spherical engaging members 67, 67 engaging with the lower ends of the coupling wires 64, 64. Furthermore, the coupling frame member 62 is capable of tilting freely around the axis X1, which is perpendicular to Y1 axis and connecting the centers P1, P1 of the spherical engaging members 67, 67 engaging with the wires 63, 63. Moreover, titling of the coupling frame member 61 around the axis X2, which is perpendicular to the above axis Y2, is converted into tilting around the axis X1 through the movement of a parallel-quadric-linkage mechanism, whose joints are respectively located at the centers Q1, Q1 of the spherical engaging members 67, 67 engaging with the upper ends of the coupling wires 64, 64 and the centers R1, R1 of the spherical engaging members 67, 67 engaging with the lower ends of the coupling wires 64, 64.

Therefore, if any length dispersion between the wires 63, 63 occurs, then the coupling frame member 62 tilts around the axis Y1. Accordingly, the length dispersion between the wires 63, 63 could be absorbed so as to avoid inclination of the clamping portion (the frame member 61). Moreover, in the event of clamping the single crystal 1 by the claws 65 of the clamping portion of the frame member 61, if the single crystal 1 is clamped in an inclined attitude, then the frame member 61 will tilt around the axes X2 and Y2. This can avoid inclination of the single crystal 1. As a result, runout of the single crystal 1 can be reduced to a small amount and the poly-crystallization can be eliminated. Thus, productivity of single crystals could be enhanced.

As described above, the following functions and effects can be obtained by employing this invention.

(1) In the event that wires are used as a measure for raising and lowering the clamping body, the clamping portion can be kept in a horizontal attitude even if the wire-engaging surface inclines due to a variation in extension of wires by a heavy load. Therefore, the single crystal can be always clamped in a vertical attitude at its original rotation axis.

(2) Even if the single crystal is clamped in an inclined attitude due to shape inaccuracy of the reduced engagement step, the omidirectional tilt center will always guide the gravity center of the single crystal to move back to its original rotation axis. Therefore, runout of the single crystal can be reduced.

(3) In the event that a shaft-type raising/lowering means is used, inclination of the wire-engaging surface induced by elongation dispersion is small enough to be ignored. However, it is possible that the single crystal is clamped in an inclined attitude due to shape inaccuracy of the reduced engagement step or manufacturing incorrectness of the clamping body. On this occasion, the omidirectional tilt center will act in the same manner as that described in (2), and the axis of the single crystal will automatically move to its original location.

(4) Runout of the single crystal 1 can be reduced to a small amount and the poly-crystallization can be eliminated. Thus, productivity of single crystals could be enhanced.

(5) in the event of equivalently substituting tilting with bending of wires, bearing members such as slide portions and rotation portions are not required. Therefore, single crystals can be grown in an uncontaminated and low-priced way.

The following is a description of an embodiment of the sacrifice member (for example, a bar-shaped body 120) employed in single crystal manufacturing device of this invention, with reference made to drawings.

Figure 18:
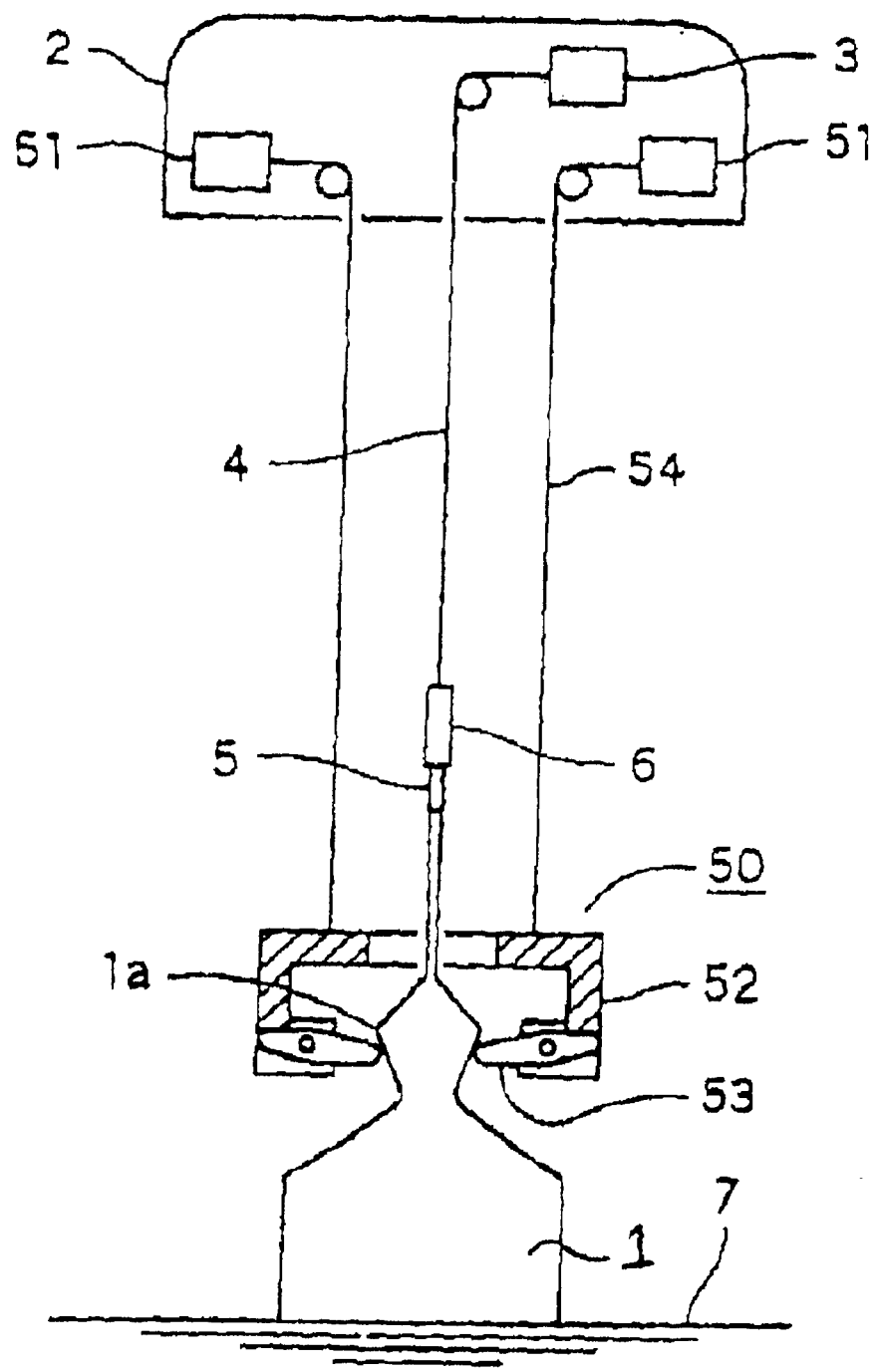
FIG. 18 is an illustration showing functions of a conventional device for pulling single crystals, which is provided with a clamping device.
Figure 19:
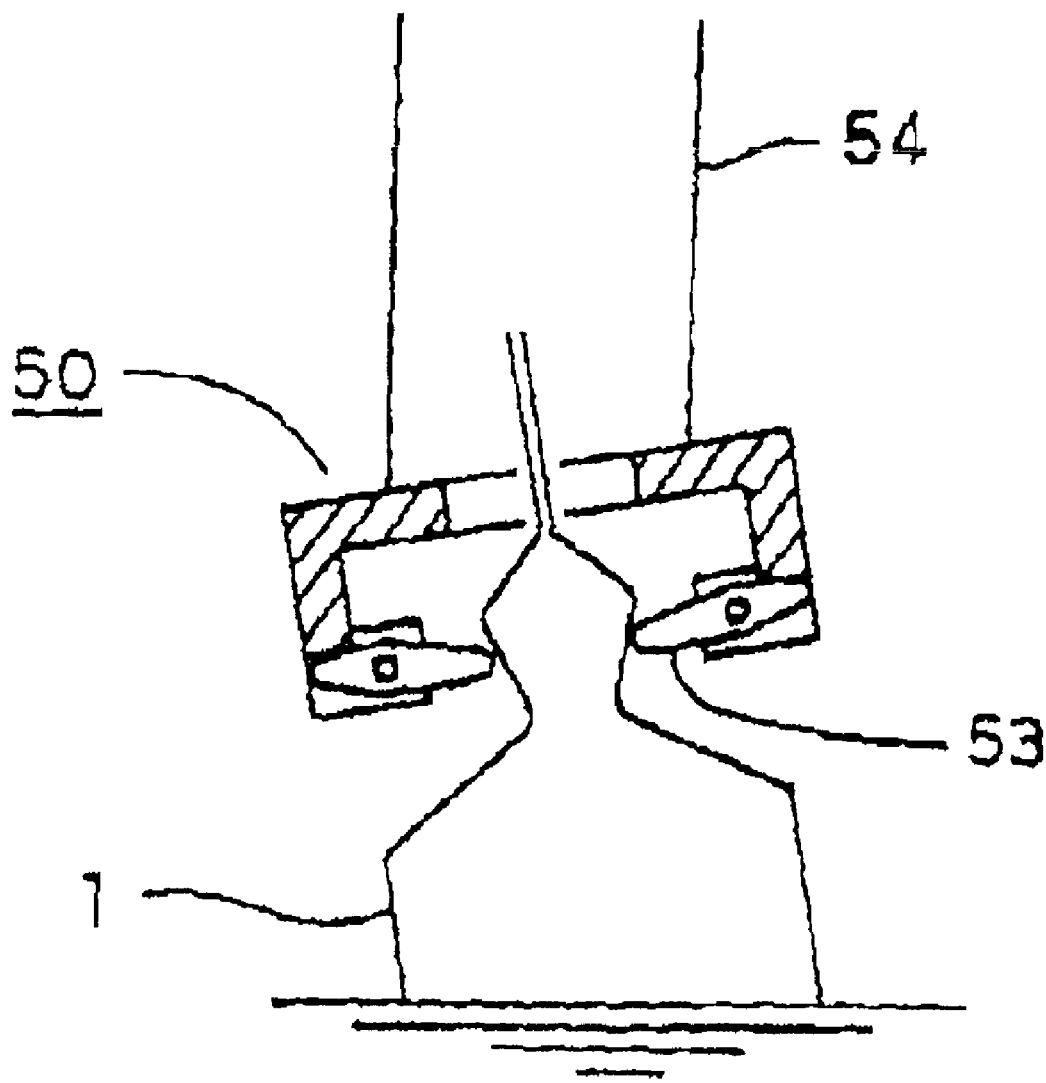
FIG. 19 is an illustration showing the inclined state of a single crystal induced by a variation in extension of wires in a conventional clamping device.
Figure 20:
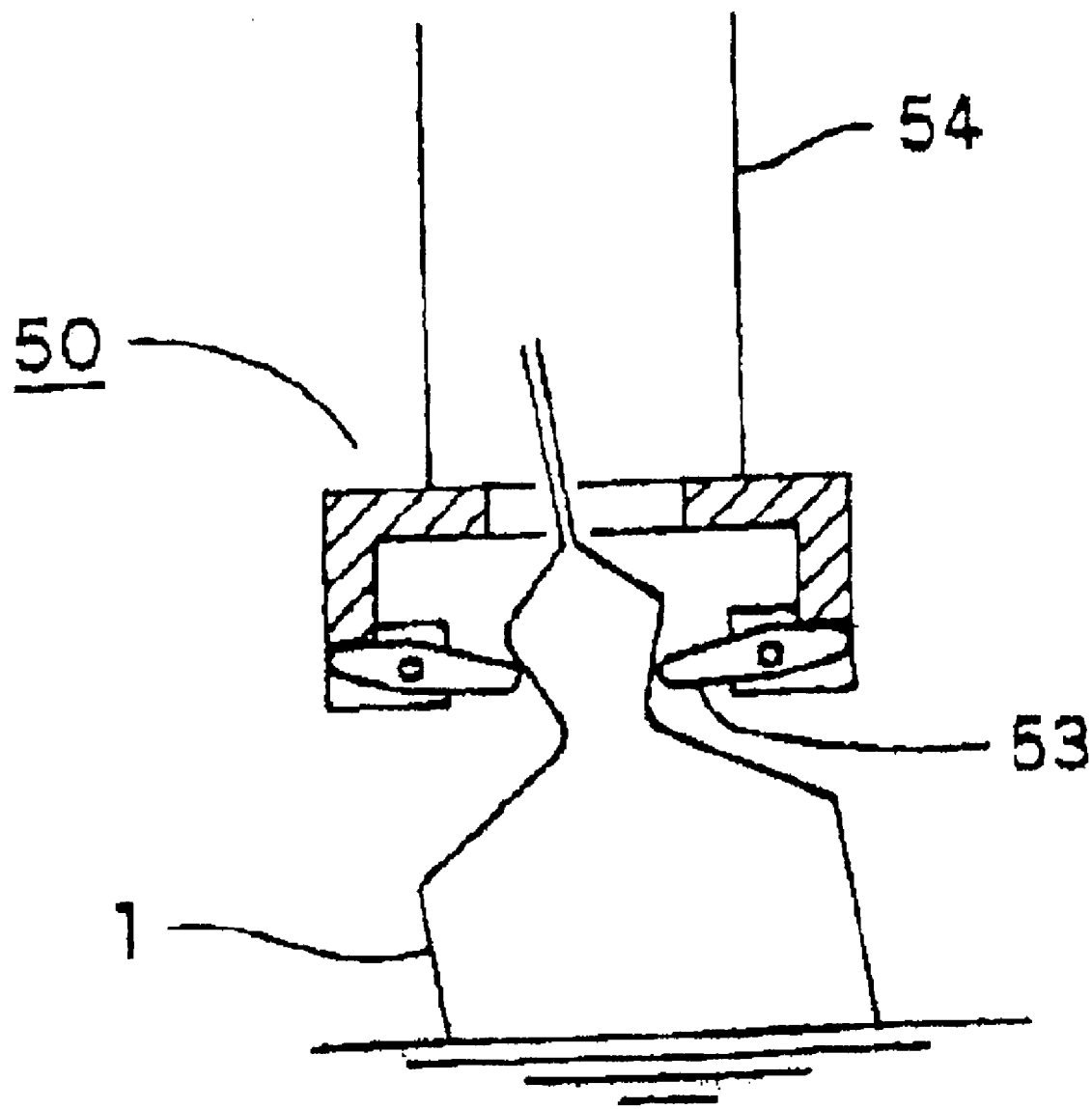
FIG. 20 is an illustration showing the state of an inclined single crystal clamped by a conventional clamping device.
Figure 21A:
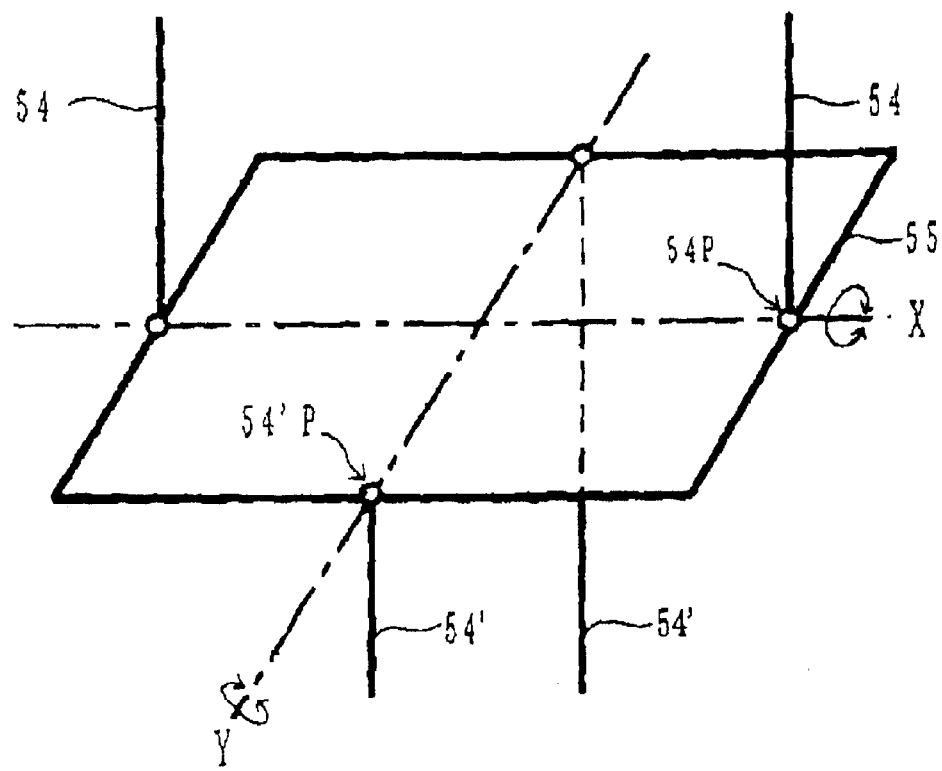
Figures 21B, 21C:
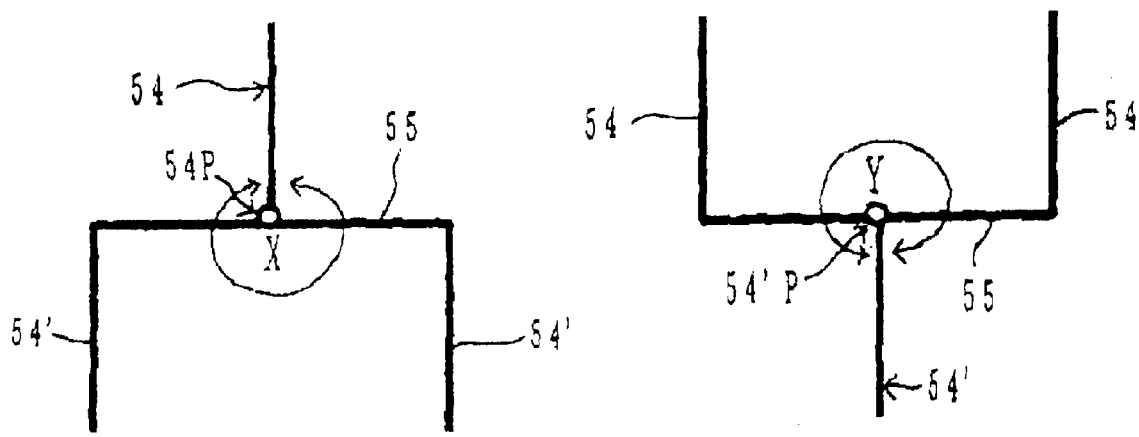
Figure 22A:
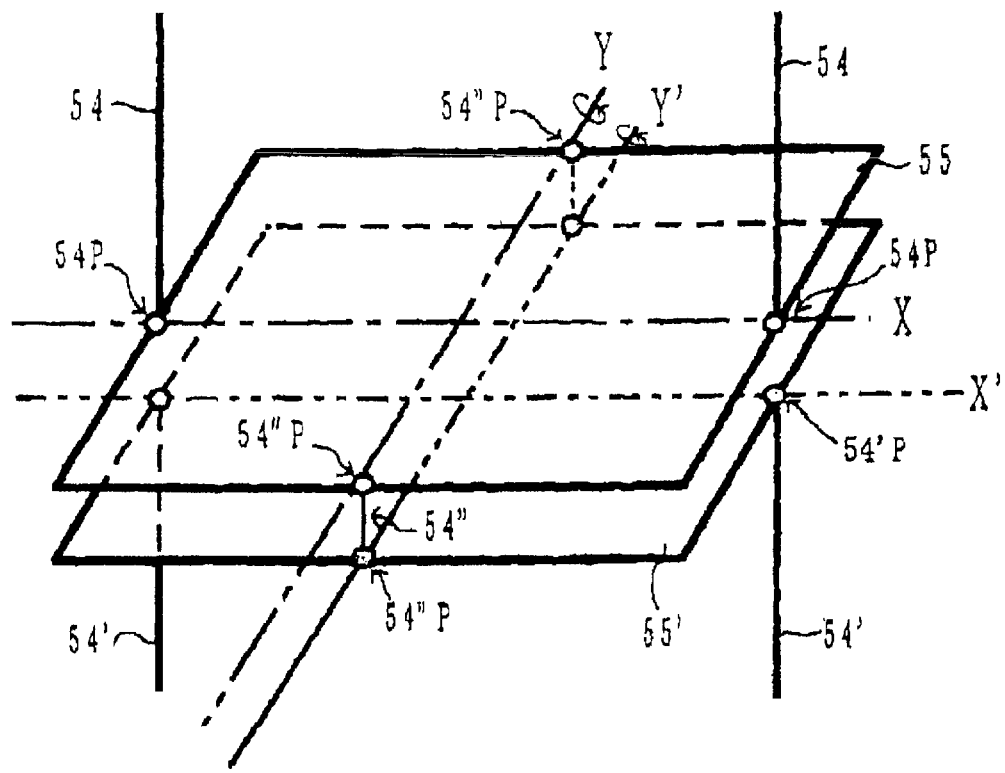
Figures 22B, 22C:
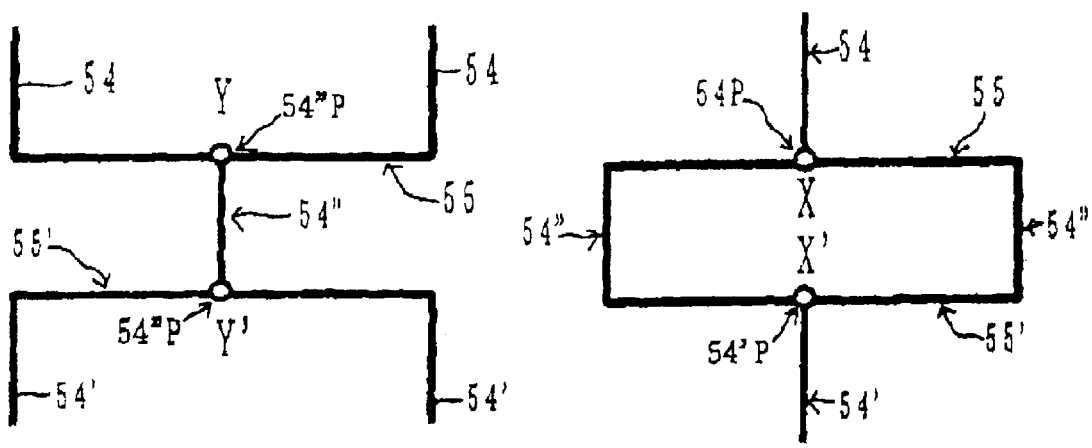
Figure 23A:
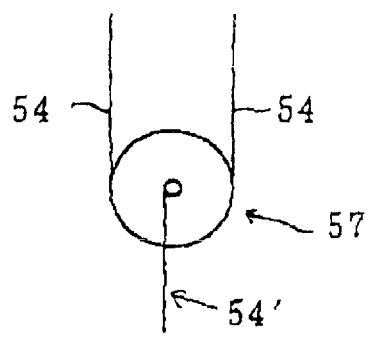
Figure 23B:
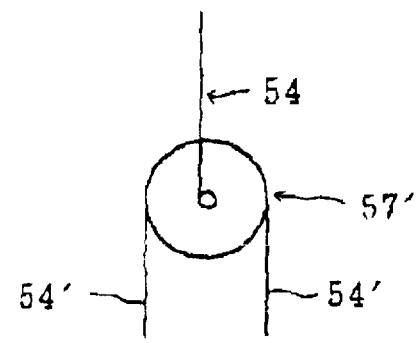
Figure 23C:
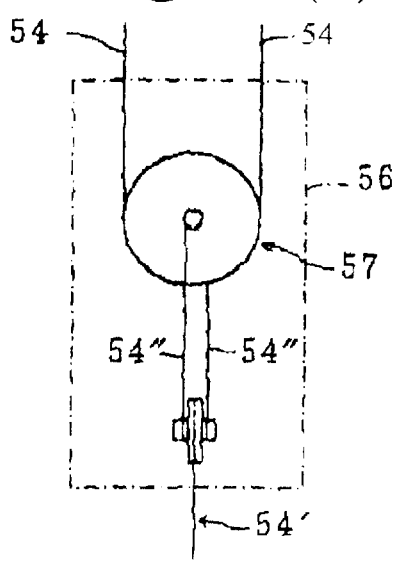
Figure 23D:
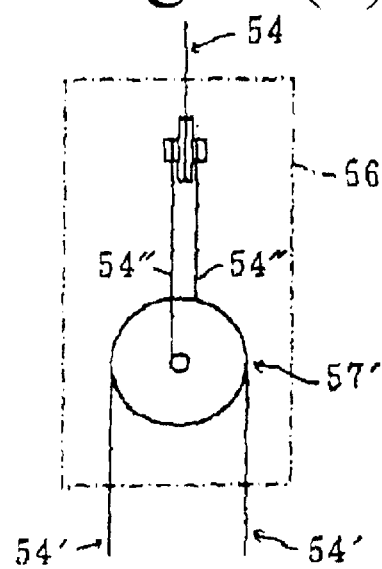
Figure 23E:
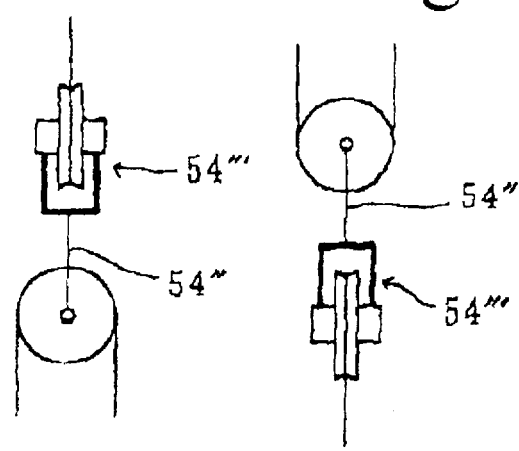
Figure 24A:
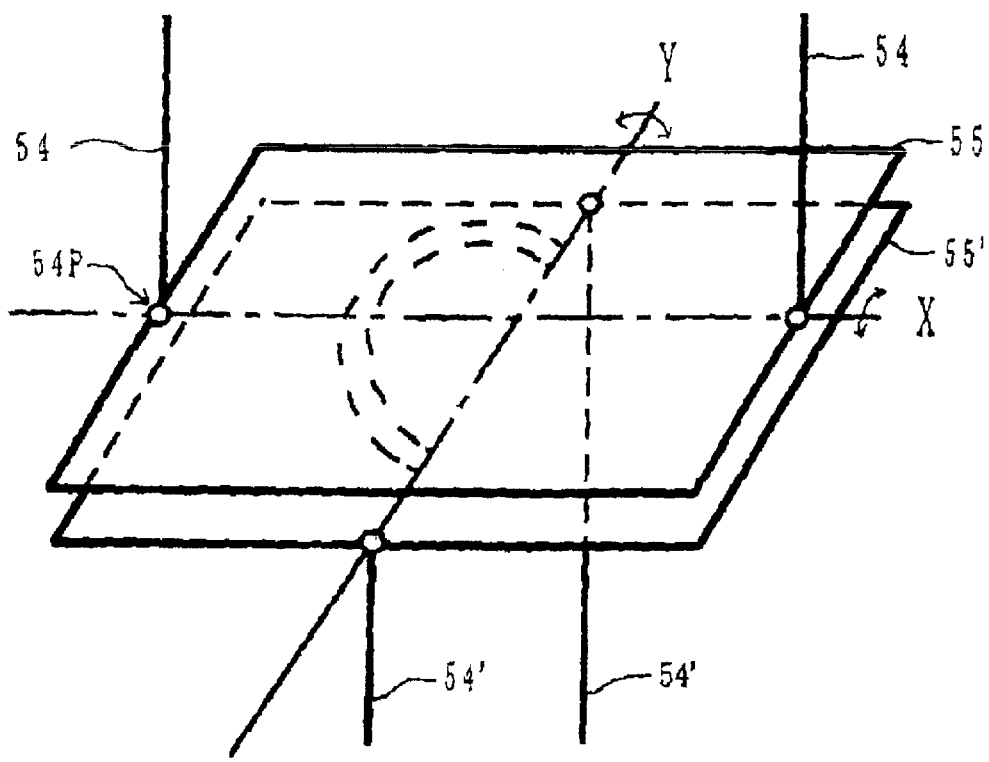
Figures 24B, 24C:
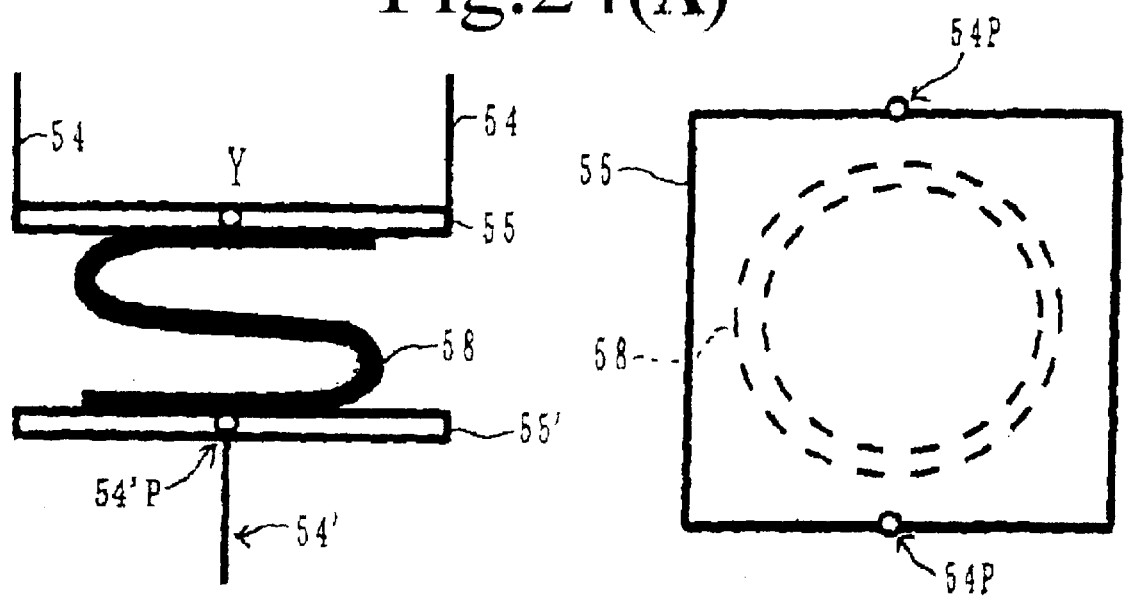
Figure 25A:
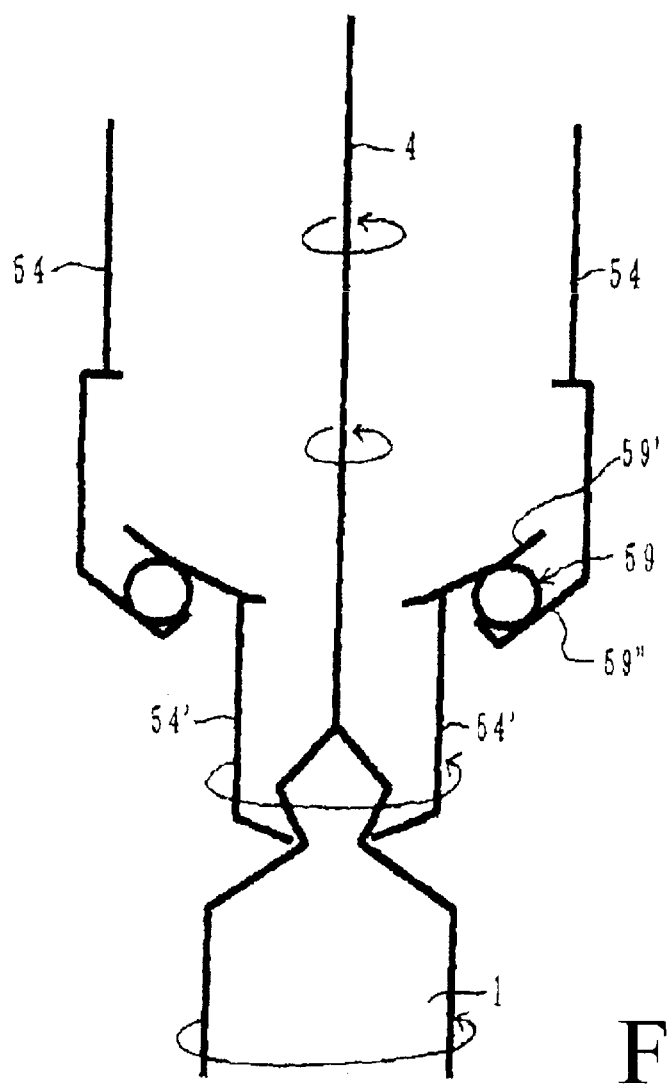
Figure 25B:
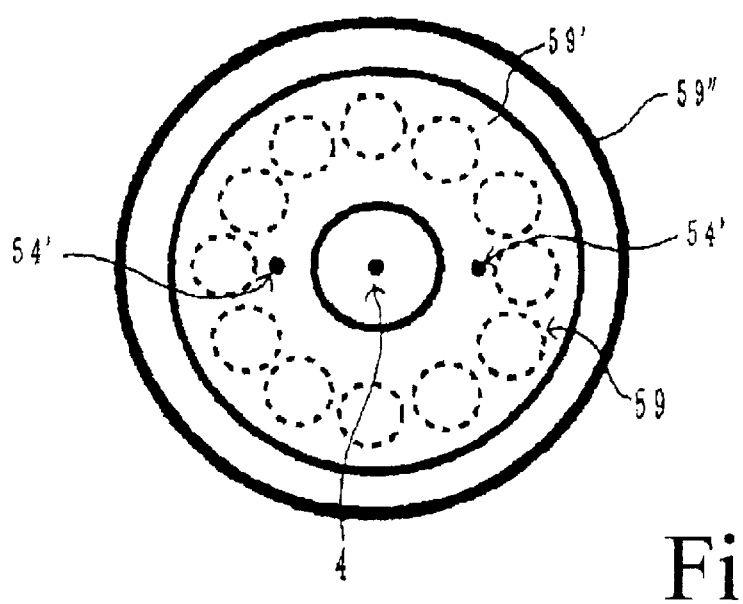
Figure 26:
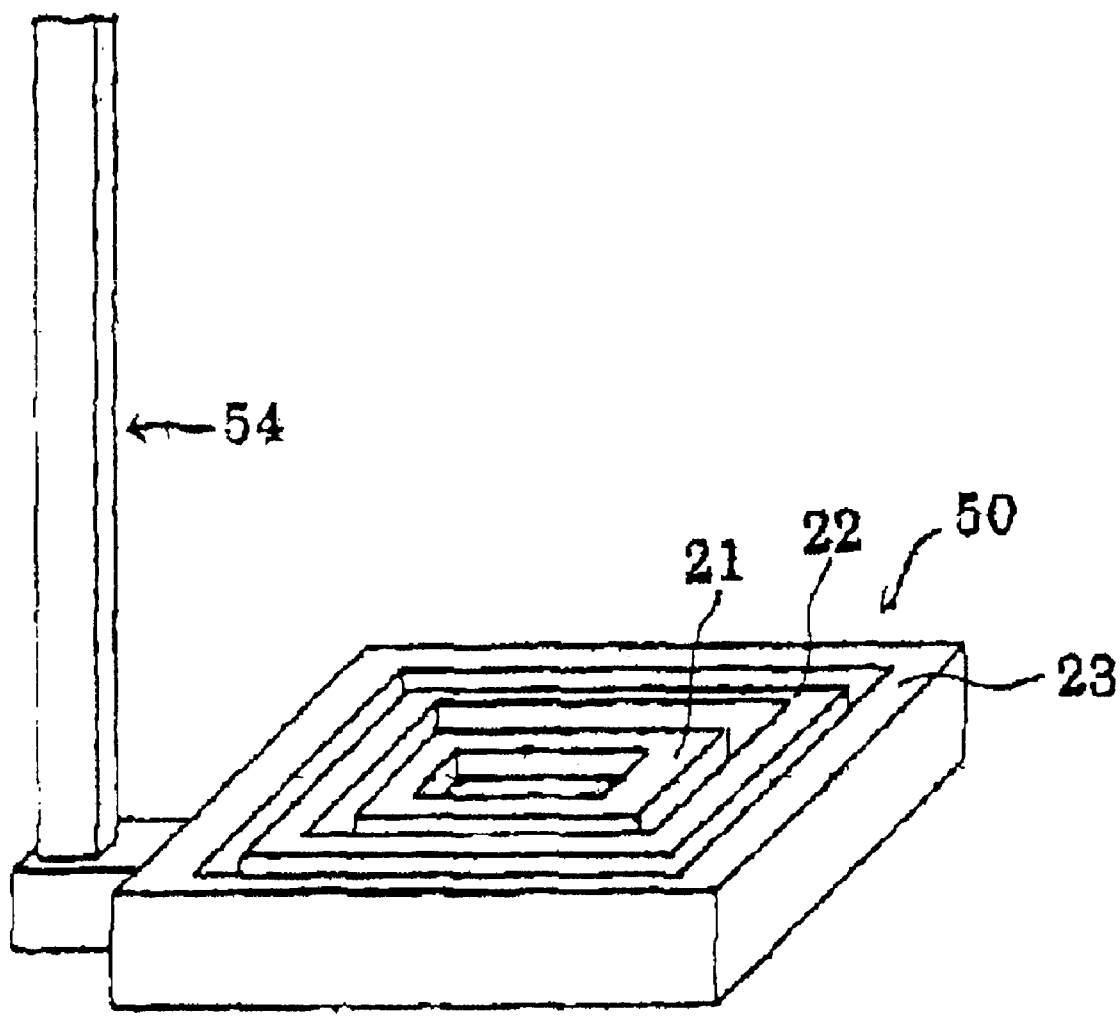
FIG. 26 is a perspective view showing an embodiment having only one long member.
Figure 27A:
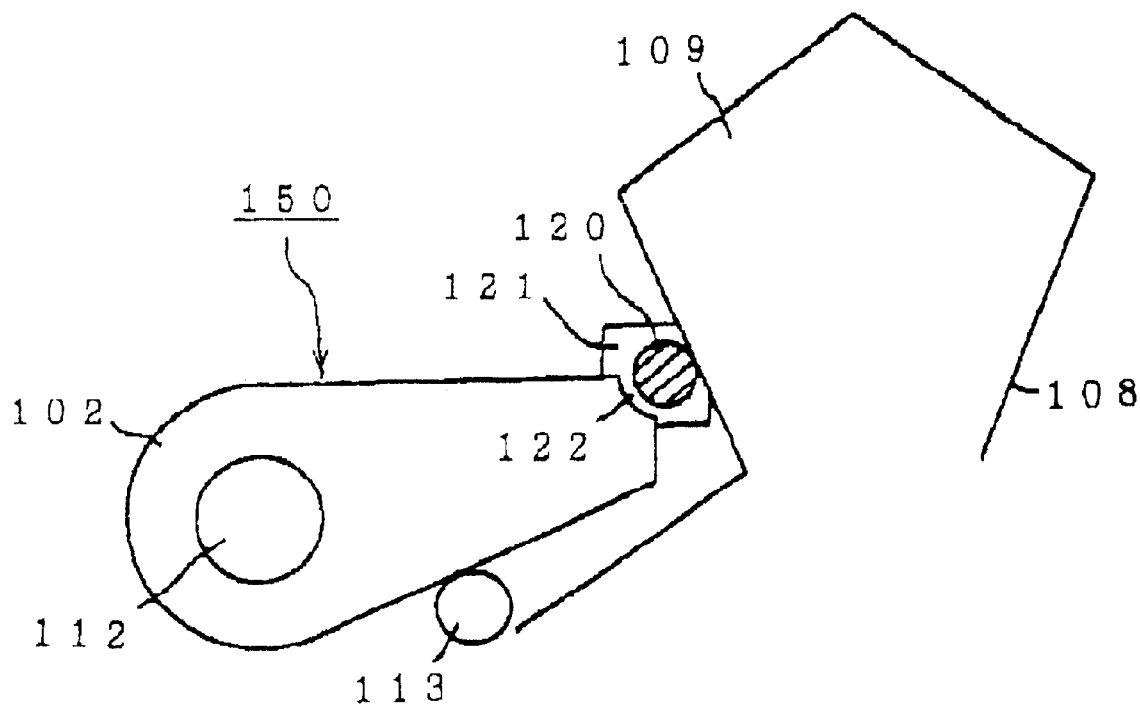
Figure 27B:
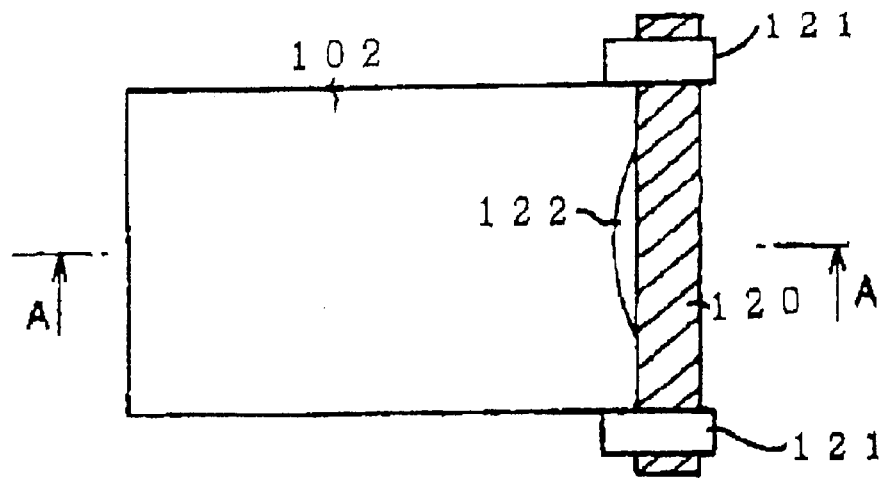
Figure 28A:
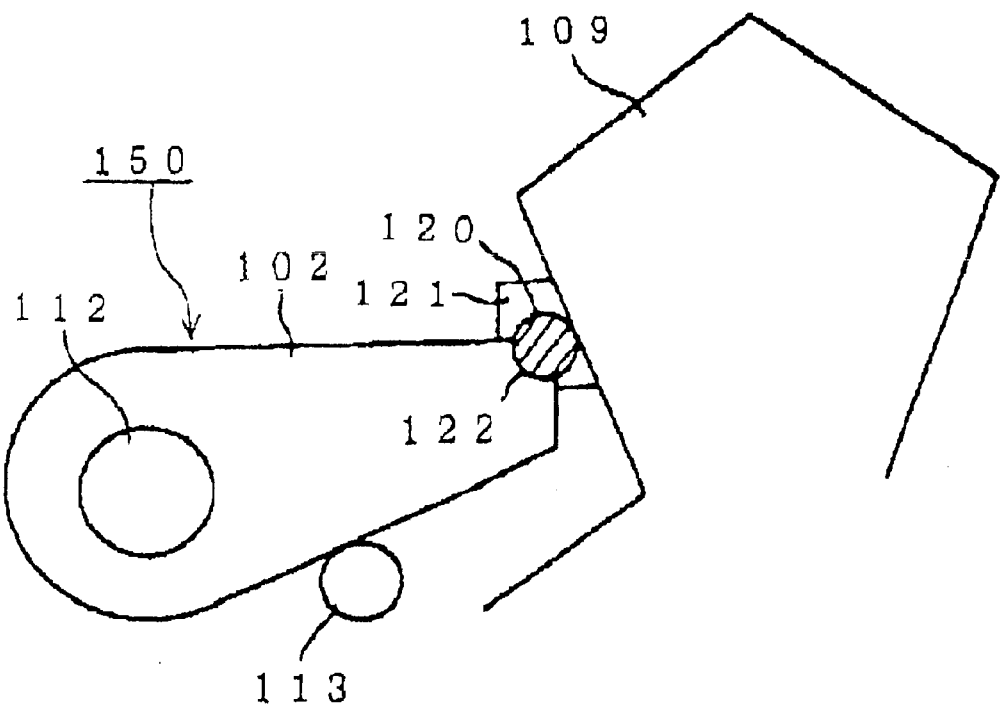
Figure 28B:
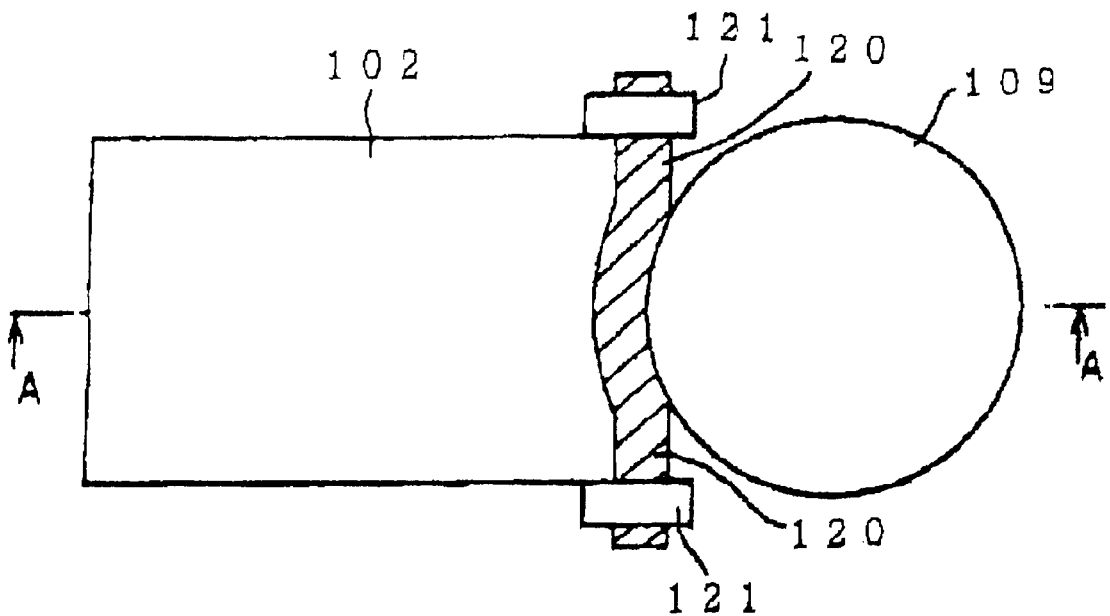

FIGS. 27A, 27B, 28A and 28B are schematic illustrations showing the states of the fifth embodiment according to this invention. The essential portion of an engaging member 150 (equivalent to member 50 in FIG. 18) installed in a single crystal pulling device is enlarged and shown therein. FIGS. 27B and 28B are top views illustrating the states of the fifth embodiment, and FIGS. 27A and 28A are cross-sectional views along lines A—A of FIGS. 27B and 28B. FIGS. 27A and 27B are showing the state before clamping a single crystal. FIGS. 28A and 28B are showing the state of clamping a single crystal.

The engaging member 150 is provided with a swaying claw body 102 capable of swaying around the sway axis 112 and a stopper 113. The swaying claw body 102 can sway, with the restriction of the stopper 113, back to its initial place by its own weight or a spring urging force.

A bar-shaped body 120 is installed on the distal end of the swaying claw body 102 via an engaging member 121. The bar-shaped body 120 is made of, for example, metal material such as: stainless, nickel or copper. Moreover, the distal end, namely the rear side of the bar-shaped body 120, is shaped into a circular recess 122.

The curvature of the recess 122 is substantially the same as that of the single crystal to be engaged.

When the portion 109 of the single crystal is being engaged, the bar-shaped body 120 installed on the engaging member 150 bends and deforms (see FIG. 28B). In other words, a deformation margin (space) 122 allowing the deformation of the bar-shaped body 120 is formed behind the bar-shaped body 120. The bar-shaped body 120 will deform to fill up the deformation margin (space) 122 when a pushing force induced by the weight of the single crystal. Therefore, according to the above single crystal supporting structure, the contact surface between the single crystal and the engaging member 150 is increased and the surface pressure exerted on the single crystal is thus reduced.

Namely, in this embodiment, the contact surface between the single crystal and the bar-shaped body 120 can be increased and the surface pressure exerted on the single crystal can be reduced by forming a deformation margin 122 behind the bar-shaped body 120 to allow the deformation of the bar-shaped body 120 and positively deforming the bar-shaped body 120. Therefore, according to this embodiment, breakage or cracking of the single crystal remaining in a pulled state can be eliminated.

On this occasion, the bar-shaped body 120 deforms in a plastic manner; namely its shape can not be restored. Accordingly, the bar-shaped body 120 has to be replaced after each single crystals pulling.

FIGS. 29A, 29B, 29C and 29D are schematic illustrations showing a variety of alternative examples for the bar-shaped body 120.

A bar-shaped body 120 in the shape of a hollow pipe is shown in FIG. 29A. The bar-shaped body 120 is inclined to deform under a stress induced by the weight of a single crystal. A bar-shaped body 120 with metal fibers 123 packed in its hollow interior is shown in FIG. 29B. By this arrangement, abrupt deformation induced by the weight of a single crystal can be avoided, and sudden load will not be imposed on the single crystal remaining in a pulled state.

A bar-shaped body 120 with plural bundled wires 124 packed therein is shown in FIG. 29C. By this arrangement, abrupt deformation induced by the weight of a single crystal can be avoided. A bar-shaped body 120 consisting of plural bundled wires 124 is shown in FIG. 29D. Compared with the single thick bar-shaped body shown in FIGS. 27A and 27B, the bar-shaped body shown in FIG. 29D is much easier to deform under a stress.

Figure 30:
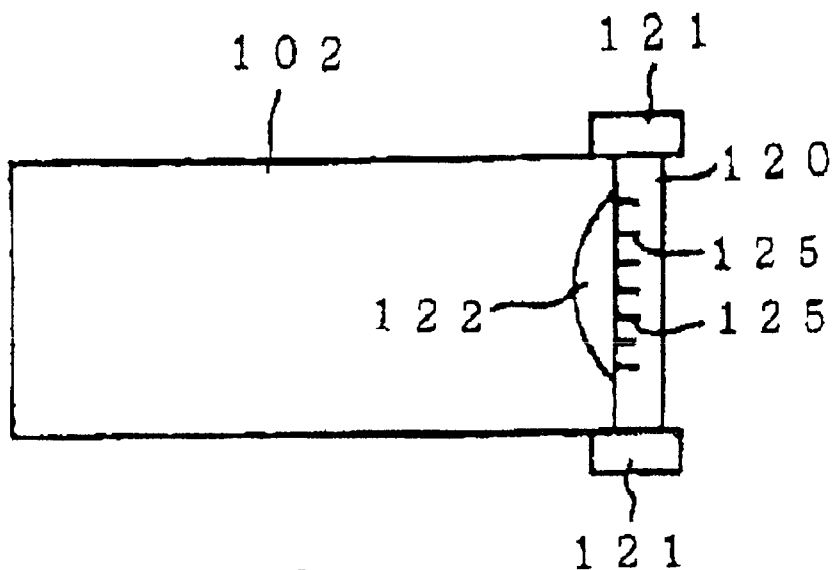
FIG. 30 is an illustration showing the sixth embodiment according to this invention.
Figure 31:
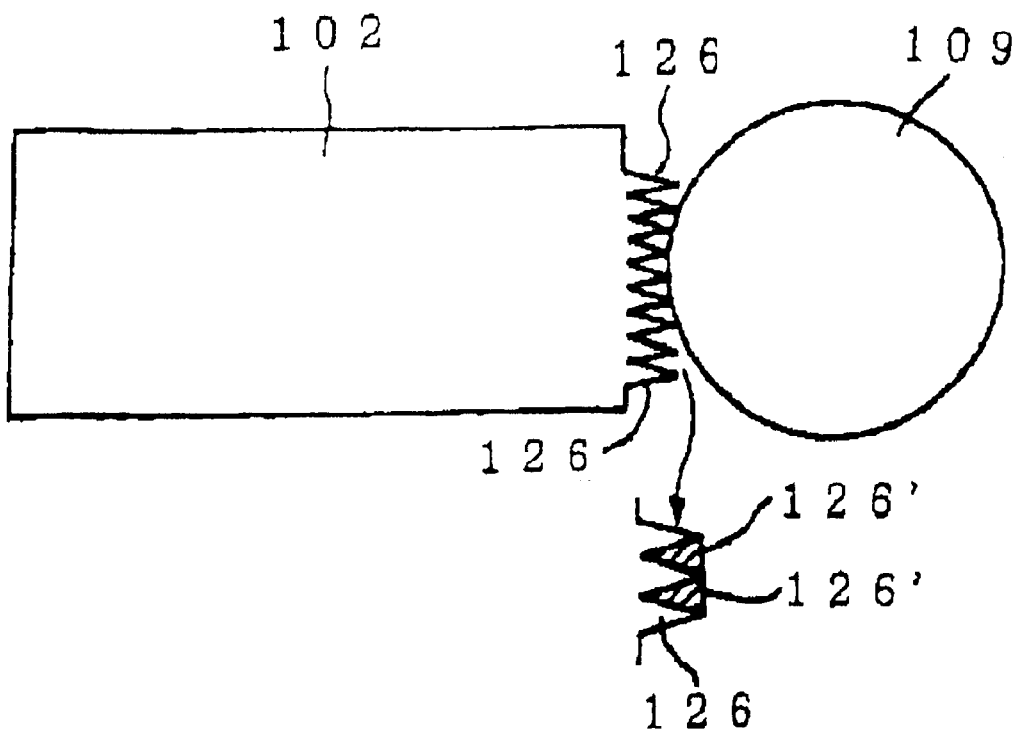
FIG. 31 is an illustration showing the seventh embodiment according to this invention.

FIG. 30 is an illustration showing the sixth embodiment according to this invention. In this embodiment, plural notches 125 are formed on the rear side (the side opposite to the side in contact with the single crystal) of the bar-shaped body 120. By this arrangement, the bar-shaped body 120 is easy to bend and deform. FIG. 31 is an illustration showing the seventh embodiment according to this invention. In this embodiment, plural triangular protrusions 126 are formed on the distal end of the swaying claw body 102. Namely, margin 126' between each pair of the triangular protrusions 126 is used as a recessed space (collapse margin). Therefore, the distal end of the swaying claw body 102 is easy to break down, and the contact surface between the single crystal and the swaying claw body is thus increased.

Figure 32A:
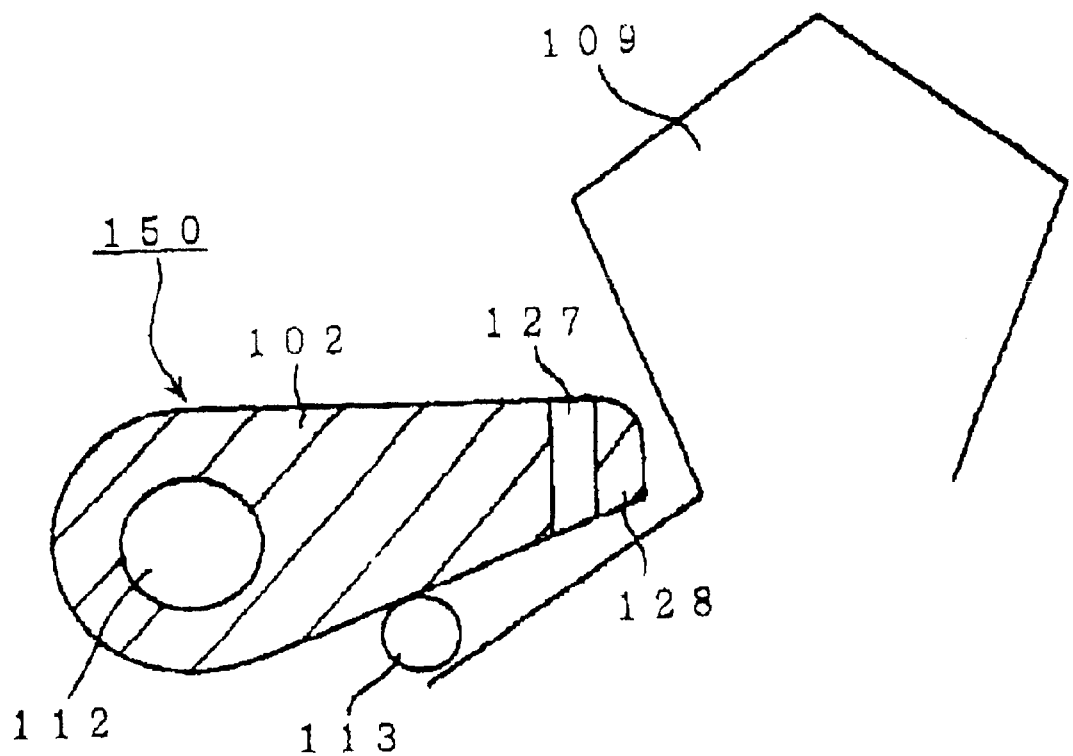
Figure 32B:
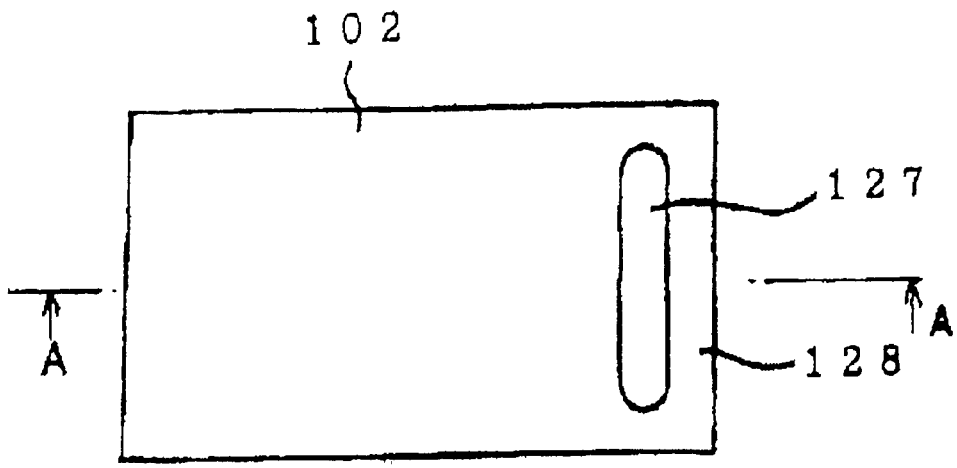
Figure 33A:
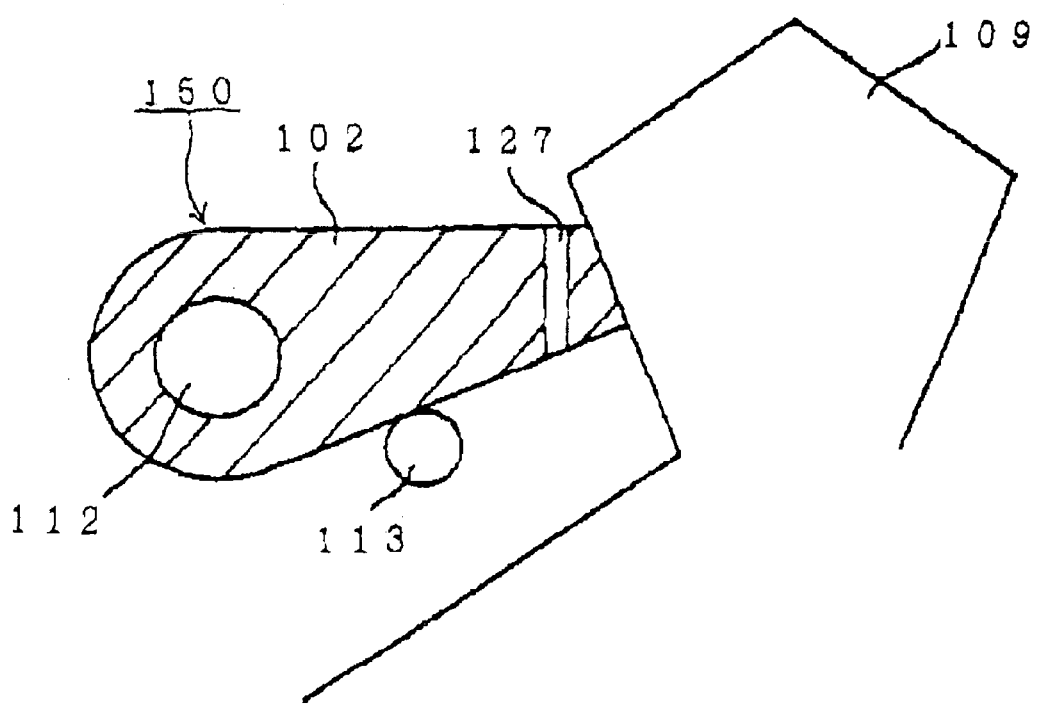
Figure 33B:
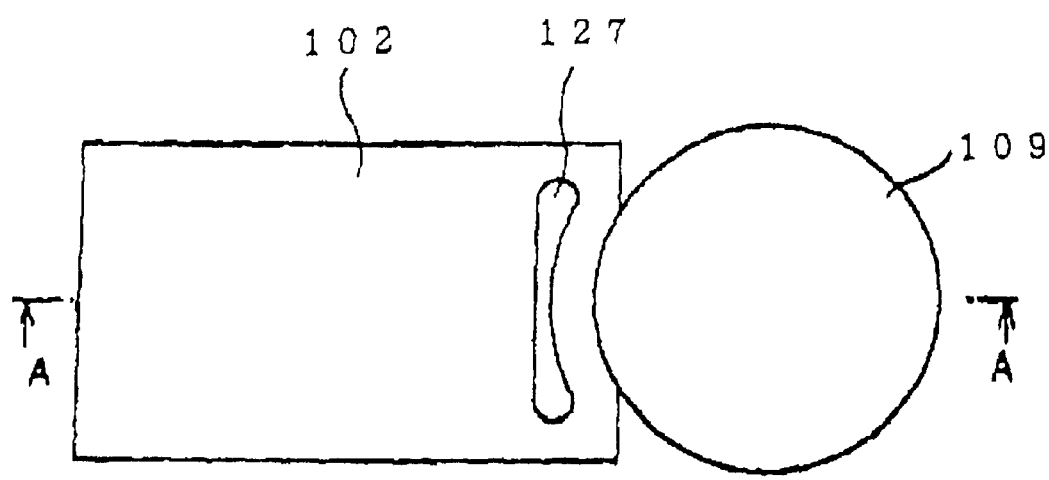

FIGS. 32A, 32B, 33A and 33B are schematic illustrations showing the eighth embodiment according to this invention. FIGS. 32B and 33B are top views illustrating the state of the eighth embodiment, and FIGS. 32A and 33A are cross-sectional views along lines A—A of FIGS. 32B and 33B. FIGS. 32A and 32B are showing the state before clamping a single crystal. FIGS. 33A and 33B are showing the state of clamping a single crystal.

Figure 34A:
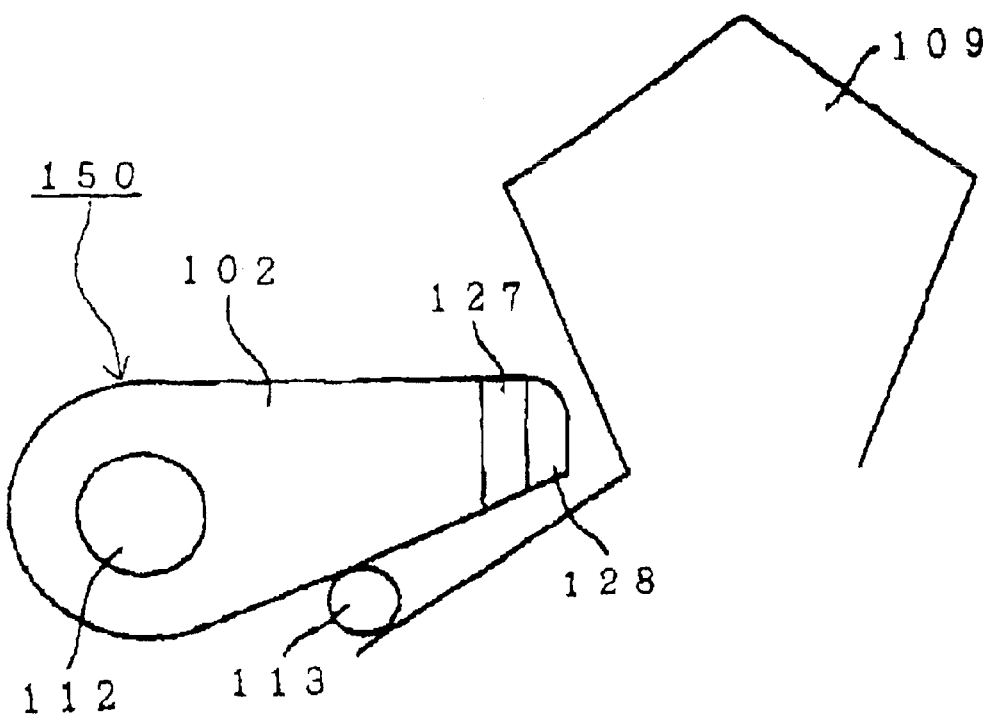
Figure 34B:
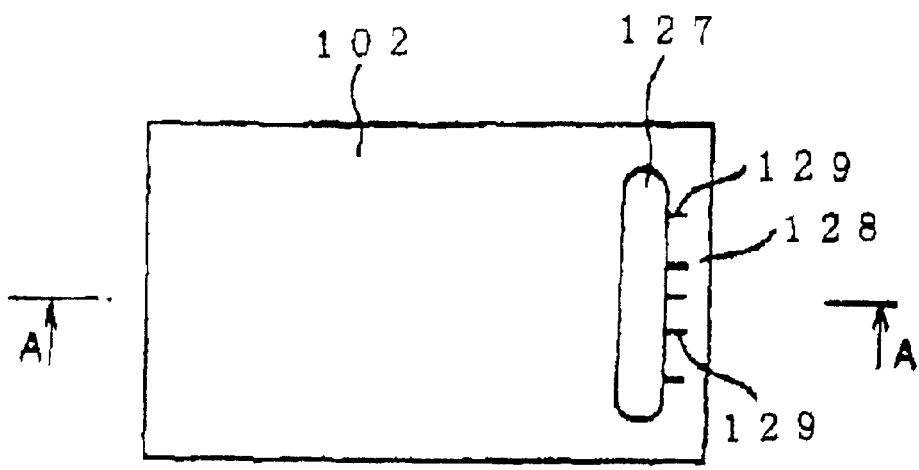
Figure 35A:
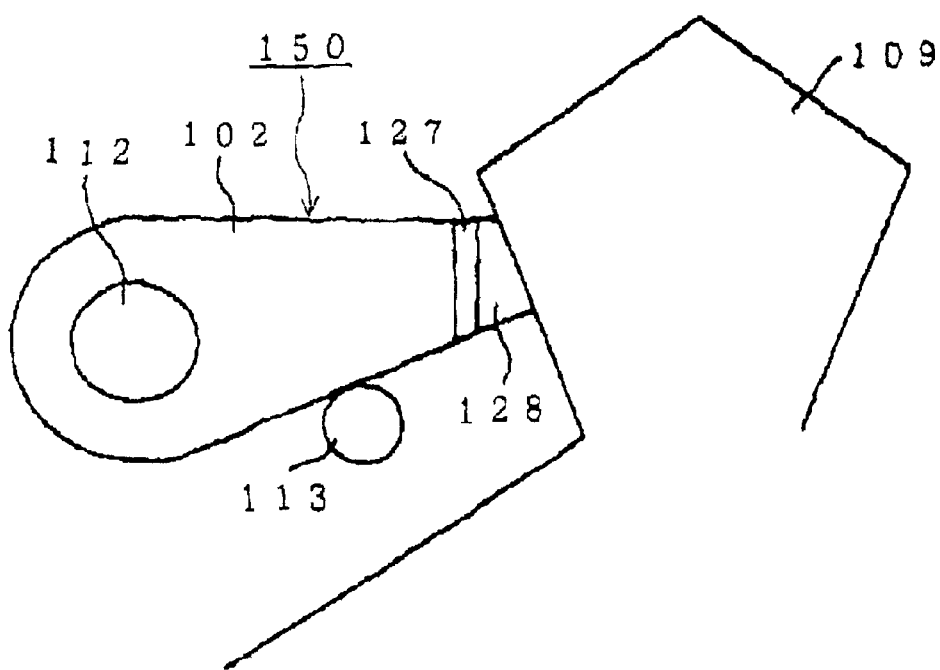
Figure 35B:
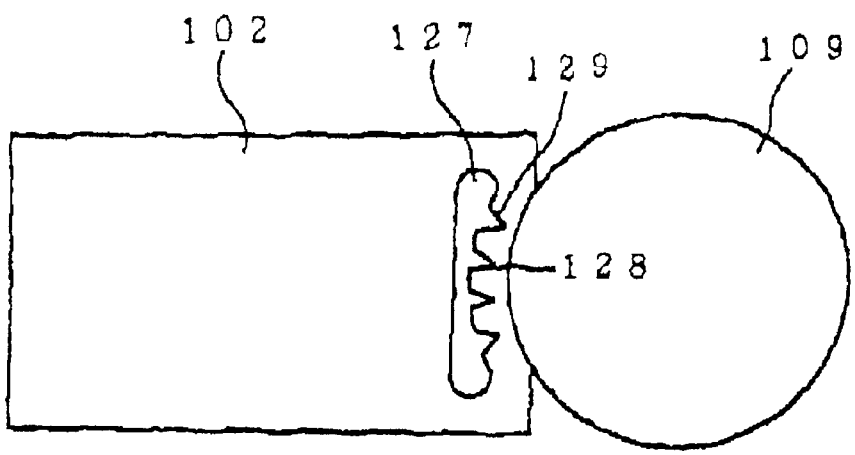

In the eighth embodiment, the contact surface between the single crystal and the swaying claw body 102 is increased by improving the shape of the distal end of the claw body 102. Therefore, the surface pressure exerted on the single crystal can be reduced. In FIGS. 32A, 32B, 33A and 33B, a long thin slot 127 is formed in the distal end of the claw body 102. The slot 127 extends in a direction substantially perpendicular to the direction in which the weight of the single crystal exerting on the distal end of the claw body 102. Namely, a space (deformation margin) allowing the portion 128 located between the slot 127 and the single crystal 109 to positively deform during the exerting of a single crystal weight is formed by molding the slot 127 in the distal end of the claw body 102. Therefore, when the weight of the single crystal is applied, the portion 128 located between the slot 127 and the single crystal 109 deforms and collapses toward the slot 127 by the pushing force coming from the single crystal 109 (see FIGS. 33A and 33B). As a result, same as the previous embodiment, the contact surface between the single crystal and the distal end of the swaying claw body in this embodiment is larger than those in conventional ones. Therefore, the surface pressure exerted on the single crystal can be reduced. FIGS. 34A, 34B, 35A and 35B are schematic illustrations showing the ninth embodiment according to this invention. FIGS. 34B and 35B are top views illustrating the state of the ninth and FIGS. 34A and 35A are cross-sectional views along lines A—A of FIGS. 34B and 35B. FIGS. 34A and 34B are showing the state before clamping a single crystal. FIGS. 35A and 35B are showing the state of clamping a single crystal.

In the ninth embodiment, same as the previous embodiment, a long thin slot 127 is formed in the distal end of the claw body 102, and plural notches 129 extending from the slot 127 in a direction perpendicular to the extending direction of the slot 127 are formed. In the above structure, when the weight of the single crystal is applied, the portion 128 located between the slot 127 and the single crystal 109 deforms and collapses toward the slot 127 by the pushing force coming from the single crystal 109 (see FIGS. 35A and 35B). During deforming, the notches 129 formed in the portion 128 located between the slot 127 and the single crystal 109 are enlarged (see FIG. 35B). Compared with those shown in FIGS. 32A, 32B, 33A and 33B, the portion 128 of this embodiment is much easier to bend and deform due to the existence of the notches 129. Therefore, the contact surface between the single crystal and the swaying claw body in this embodiment can be increased.

Furthermore, in the above embodiments, the swaying claw bodies 102 were employed as engaging members for engaging with the single crystal. However, it is also acceptable to use other engaging mechanisms capable of performing the same functions. Moreover, in the above embodiments, one pair of swaying claw bodies 102 were employed to engage with the single crystal. Nevertheless, it is also satisfactory to use more than three swaying claw bodies to engage with the single crystal.

What is claimed is:

1. An apparatus for producing a single crystal, which forms a engagement step in the single crystal remaining in a pulled state by the CZ method and suspends the single crystal with the aid of the engagement step, comprising:
   a clamping body used for clamping the engagement step, and at least two contact points in contact with the engagement step being provided;
   a long member for suspending the clamping body; and
   a free-pivoting mechanism having a first flexible member capable of tilting even though the single crystal is being clamped by the clamping body, and a second flexible member capable of tilting even though the clamping body is being suspended by the long members.

2. An apparatus for producing a single crystal, which forms a engagement step in the single crystal remaining in a pulled state by the CZ method and suspends the single crystal with said aid of the engagement step, comprising:
   a clamping body used for clamping the engagement step, and at least two contact points in contact with said engagement step being provided;
   two long members for suspending the clamping body; and
   a free-pivoting mechanism used for absorbing the dimensional discrepancy induced by length dispersion among the plural long members and the dimensional discrepancy induced by an offset in the points clamped by the clamping body on the engagement step and the free-pivoting mechanism including a combination of a plurality of pivots whose rotational axes are not parallel to one another.

3. The apparatus for producing a single crystal as described in claim 2, wherein the free-pivoting mechanism is capable of tilting in any direction within 360°.

4. The apparatus for producing a single crystal as described in claim 3, wherein the free-pivoting mechanism includes an elastic member whose elastic deformation enables the tilting of the free-pivoting mechanism.

5. The apparatus for producing a single crystal as described in claim 3, wherein the free-pivoting mechanism includes a sliding member whose sliding movement enables the tilting of the free-pivoting mechanism.

6. The apparatus for producing a single crystal as described in claim 3, wherein the free-pivoting mechanism includes a seesaw member capable of tilting around an axis, and the free-pivoting mechanism is driven to tilt by the action of the seesaw member.

7. The apparatus for producing a single crystal as described in claim 3, wherein the free-pivoting mechanism is composed of a plurality of seesaw members each of which is capable of tilting around an axis, and the predetermined axes of the respective seesaw members are arranged so as not to be coaxial with one another.

8. The apparatus for producing a single crystal as described in claim 7, wherein the sum of the plural seesaw members is two.

9. The apparatus for producing a single crystal as described in claim 8, wherein the sum of the long members is two.

10. The apparatus for producing a single crystal as described in claim 8, wherein the axes of the two seesaw members are set so as to cross each other.

11. An apparatus for producing a single crystal, the device forming a engagement step in the single crystal remaining in a pulled state by the CZ method and suspending the single crystal with the aid of the engagement step, the device comprising a clamping body used for clamping the engagement step, a long member for suspending the clamping body, and a free-pivoting mechanism having a first flexible member capable of tilting even that the single crystal is being clamped by the clamping body and/or a second flexible member capable of tilting even that the clamping body is being suspended by the long member, characterized in that:
   the portion of the clamping body which comes into contact with the engagement step when the clamping body clamps the engagement step is formed from a sacrifice member which is deformed so as to fit the profile of the circumference of the engagement step.

12. An apparatus for producing a single crystal, the device forming a engagement step in the single crystal remaining in a pulled state by the CZ method and suspending the single crystal with the aid of the engagement step, the device comprising a clamping body used for clamping the engagement step and a plurality of long members for suspending the clamping body, characterized in that:

the portion of the clamping body which comes into contact with the engagement step when the clamping body clamps the engagement step is formed from a sacrifice member which is deformed so as to fit the profile of the circumference of the engagement step.

13. The apparatus for producing a single crystal as described in claim 12, wherein the sacrifice member is exchangeable and capable of being affixed or detached freely.

14. The apparatus for producing a single crystal as described in claim 13, wherein the sacrifice member is provided with plural protrusion elements extending toward the engagement step.

15. The apparatus for producing a single crystal as described in claim 13, wherein the sacrifice member is provided with a sacrifice space that gets narrower during deforming of the sacrifice member.

16. The apparatus for producing a single crystal as described in claim 15, wherein the sacrifice space is a hole divergent in a direction substantially perpendicular to the deformation direction of the sacrifice member.

17. The apparatus for producing a single crystal as described in claim 13, wherein the sacrifice member is constructed by a bar-shaped body.

18. The apparatus for producing a single crystal as described in claim 17, wherein the bar-shaped body is consisted of a metal tube and carbon material packed within the metal tube.

19. The apparatus for producing a single crystal as described in claim 18, wherein the metal tube is a stainless tube and the carbon material is carbon fibers, graphite material, or carbon-fiber-reinforced carbon.

* * * * *